United States Patent [19]

Burgener et al.

[11] Patent Number: 5,196,802
[45] Date of Patent: Mar. 23, 1993

[54] METHOD AND APPARATUS FOR CHARACTERIZING THE QUALITY OF ELECTRICALLY THIN SEMICONDUCTOR FILMS

[75] Inventors: Mark L. Burgener; Graham A. Garcia; Ronald E. Reedy, all of San Diego, Calif.

[73] Assignee: The United States of America as represented by the Secretary of the Navy, Washington, D.C.

[21] Appl. No.: 516,492

[22] Filed: Apr. 23, 1990

[51] Int. Cl.$^5$ ............................................. G01R 27/26
[52] U.S. Cl. ................................ 324/663; 324/158 D; 324/719
[58] Field of Search ............... 324/663, 158 R, 158 P, 324/715, 158 D, 719

[56] References Cited

U.S. PATENT DOCUMENTS

| | | | |
|---|---|---|---|
| 3,440,715 | 4/1969 | Seng | 324/158 R |
| 3,922,707 | 11/1975 | Freed et al. | 324/158 R |
| 3,943,442 | 3/1976 | Fletcher et al. | 324/158 D |
| 4,282,483 | 8/1981 | Kren et al. | 324/158 R |
| 4,325,025 | 4/1982 | Corcoran et al. | 324/158 R |
| 4,567,430 | 1/1986 | Carr | 324/158 R |
| 4,720,670 | 1/1988 | Boyle | 324/158 R |
| 4,859,938 | 8/1989 | Kim et al. | 324/158 R |
| 4,894,605 | 1/1990 | Ringleb et al. | 324/158 R |
| 4,906,921 | 3/1990 | Juge | 324/158 R |

FOREIGN PATENT DOCUMENTS 15017  3/1989  Japan .................................. 324/663

OTHER PUBLICATIONS

IEEE Transactions on Electrical Device vol. ED-30, No. 10 1224 Oct. 1983 Kyulim.
Applied Physics Lett., 20, Jan. 1972 A.C. Ipri.
Solid State Electron. 18,119 Hynechek Dec. 1975.
Solid State Electron. 19,997 Worley Dec. 1976.

Primary Examiner—Jack B. Harvey
Assistant Examiner—Maura K. Regan
Attorney, Agent, or Firm—Harvey Fendelman; Thomas Glenn Keough

[57] ABSTRACT

A method and apparatus for characterizing the quality of an electrically thin semiconductor film and its interfaces with adjacent materials by employing a capacitor and a topside electrical contact on the same side of the electrically thin semiconductor film to thereby permit the taking of capacitance-voltage (C-V) measurements. A computer controlled C-V measuring system is operatively coupled to the contact and capacitor to modulate the potential on the capacitor. Variation of the voltage applied to the capacitor enables modulation of the potential applied to the film to thereby vary the conductivity of the film between the capacitor gate node and the topside contact.

42 Claims, 5 Drawing Sheets

METHOD AND APPARATUS FOR CHARACTERIZING THE QUALITY OF ELECTRICALLY THIN SEMICONDUCTOR FILMS

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention generally relates to quality control of electrically thin semiconductor films (herein also referred to either as semiconductor thin films or thin films), and more particularly, to a method and apparatus for characterizing the quality of electrically thin semiconductor films and their interfaces. The phrase "electrically thin semiconductor film" is defined herein to be any semiconductor film for which there exists some surface potential such that a change in this potential results in a change in the potential at the semiconductor/substrate interface. In the semiconductor manufacturing industry, an effective way to characterize electrically thick semiconductor films is to make an electrical device on the material and then perform measurements using the device. The phrase "electrically thick semiconductor film" is defined herein to be any semiconductor film for which the potential at the semiconductor/substrate interface is independent of the surface potential for all values of the surface potential. This electrically thick film characterization technique is more sensitive than any other material diagnostic technique. The electrical device typically made on the semiconductor material for this purpose is a capacitor. Capacitance versus voltage, or C-V, measurements are made using the capacitor to characterize the quality of the electrically thick semiconductor films.

In the past, the capacitor has been made in an electrically thick semiconductor film and the C-V measurement was made by providing electrical contacts on opposite sides of the insulating substrate supporting the semiconductor layer, thus using the insulating substrate as the gate material One electrical contact was provided by the semiconductor layer itself available on the topside of the substrate. The other electrical contact was provided on the opposite side of the insulating substrate, i e. on the backside.

For the case where the insulating substrate is very thick (such as quartz or sapphire) the steps performed to provide such backside electrical contact were, first thinning the substrate (to a thickness of approximately 200 to 400 microns) and, then, evaporating metal on the backside of the thinned substrate to form the contact. The thinning step had to reduce the substrate to a thickness which would give interpretable capacities. Several problems are presented with this manner of making electrical contacts with a capacitor on the semiconductor material when taking the required C-V measurements. One problem is that the substrate thinning process is time consuming. Another problem is that the thinning process itself may affect the interface between the insulating substrate and semiconductor layer so as to change its electrical properties and thereby produce distorted results. A further problem is that even after thinning, thousands of volts of bias are required to accomplish the measurements. An additional problem is that the signal-to-noise ratio of the data is small because the thinned substrate is still many times thicker than the semiconductor film. Finally, as a consequence of the small signal-to-noise ratio this measurement has been restricted to doped, electrically thick semiconductor films.

For the case where the substrate is thin enough initially such that thinning is not required (such as Self-Implanted-OXide or SIMOX) the backside electrical contact is made either directly to a conducting substrate if one is used such as, for example silicon in the case of SIMOX, that is supporting the insulator or to an evaporated conductor such as aluminum. The problem with this type of technique is that it has been restricted to electrically thick semiconductor films. To make such films usually requires special processing thus increasing the complexity and cost of the measurement.

Consequently, there has been a long-felt need to devise a more reliable, quicker and simpler measurement technique for characterizing the quality of electrically thin semiconductor films.

SUMMARY OF THE INVENTION

The present invention satisfies the above described long-felt need and relates to a method and apparatus for characterizing the quality of electrically thin semiconductor films and their interfaces, including interfaces with gate materials, substrate materials and semiconductor compound materials such as epilayer oxides. The method and apparatus of the present invention employ a pair of electrical contacts on the same side of the film, i.e. the topside, to permit C-V measurements of electrically thin semiconductor films and their interfaces with the substrates such as insulating substrates such that derived C-V data is meaningful By eliminating the use of an electrical contact on the opposite side of the substrate, the method and apparatus of the present invention obviate the need for performance of the time-consuming substrate thinning process and/or the need for an electrically thick film. The primary advantage of the present invention is that it allows quick sampling and inspection of electrically thin semiconductor films, such as silicon films, in an integrated circuit manufacturing environment which up to the present has not been possible.

The C-V measurements provide pertinent information concerning the electrical characteristics of the electrically thin semiconductor films and the interfaces with substrates and other interfaces. These measurements are interpreted to reach a judgement as to the quality of the electrically thin semiconductor films and interfaces. Also, the method of the present invention has a large signal-to-noise figure of merit.

OBJECTS OF THE INVENTION

Accordingly, it is the primary object of the present invention to disclose a simple, quick and reliable method and apparatus for characterizing electrically thin semiconductor films and their interfaces.

Another object of the present invention is to disclose a method and apparatus for characterizing electrically thin semiconductor films and their interfaces by interpretation of low frequency C-V measurements.

Still another object of the present invention is to disclose a method and apparatus for characterizing an electrically thin semiconductor film by employing a pair of electrical contacts on the same side of the film, one contacting a capacitor made on the film and the other contacting the film itself.

Other objects, advantages and novel features of the invention will become apparent from the following detailed description of the invention when considered in conjunction with the accompanying drawings.

DETAILED DESCRIPTION OF THE INVENTION

Improved Characterization of Semiconductor Material

Figure 1:
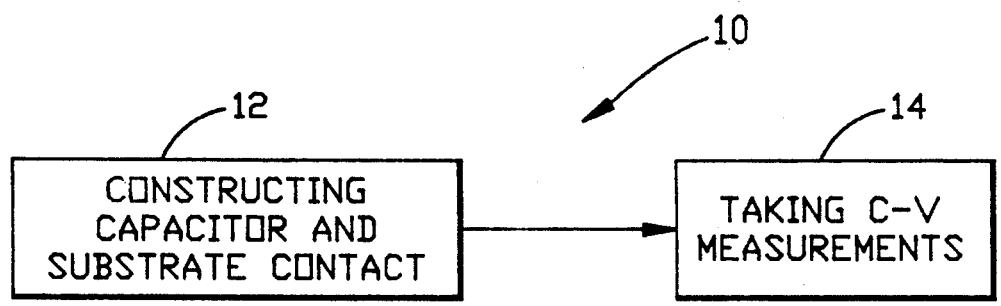
FIG. 1 is a flow diagram depicting a method of characterizing semiconductor material in accordance with the present invention.

Referring now to the drawings. FIG. 1 illustrates a flow diagram 10 depicting the basic steps of the method for characterizing the quality of an electrically thin semiconductor film in accordance with the present invention.

The characterizing method as illustrated by the flow diagram 10 is performed with respect to a sample of semiconductor material composed of semiconductor and substrate layers. The method basically includes a first step, as represented by block 12 of flow diagram 10, of constructing a capacitor and a pair of electrical contacts on the same side of the semiconductor layer of the material, and a second step, as represented by block 14 of flow diagram 10, of taking capacitance and voltage, C-V, measurements which provide the electrical transfer characteristics of the capacitor.

The first step (block 12) of the method utilizes a number of additional steps which are similar to those involved in processes used conventionally in constructing layered semiconductor devices and thus need only be briefly described. First, the semiconductor is cleaned. Next, a gate oxide to provide the insulator layer of the capacitor is grown or deposited on the semiconductor layer. Then, through a sequence of steps which may, for example, include depositing a conductive metal layer, then depositing, curing and removal of a photoresist mask and unmasked metal, and sintering the remaining masked metal, the capacitor and electrical contacts are formed on the semiconductor layer and the substrate. Likewise, other methods could be used to form the capacitor and contacts within the scope of the present invention. The second step (block 14) of the method is carried out by operation of a C-V measuring system which will be described below.

Figure 2:
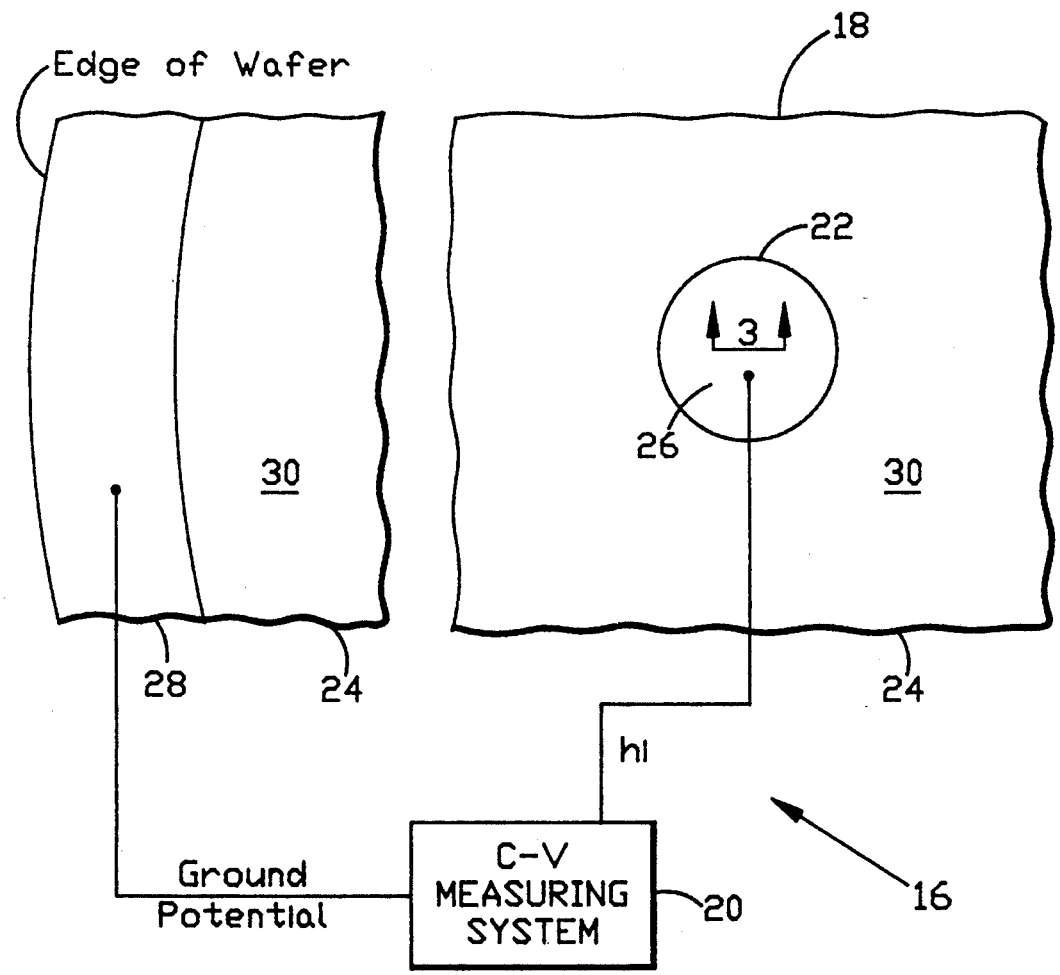
FIG. 2 is a general diagram of an apparatus for characterizing semiconductor material in accordance with the present invention.
Figure 3:
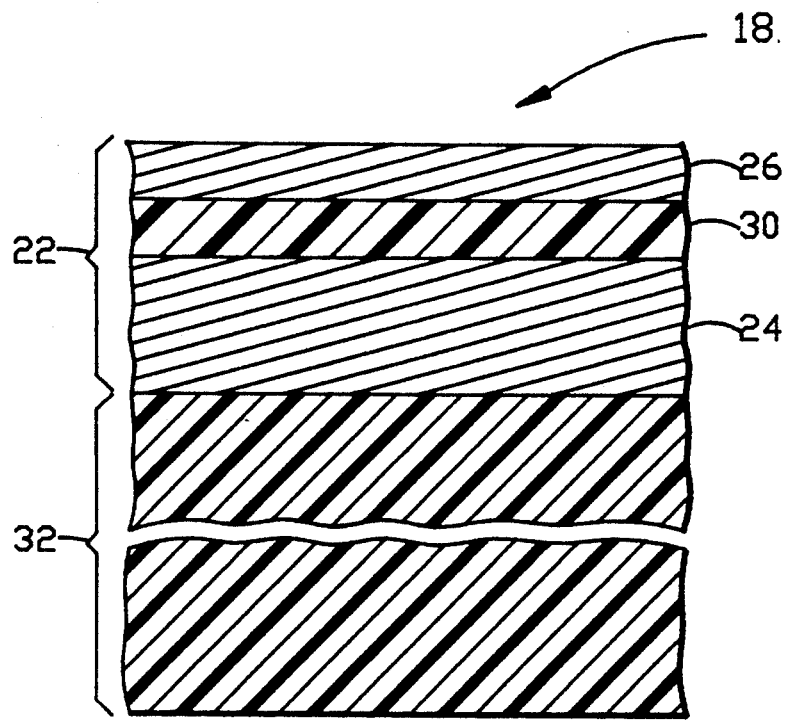
FIG. 3 is an enlarged cross-sectional view taken along line 3—3 of FIG. 2 of a semiconductor device of the characterizing apparatus.

FIG. 2 generally illustrates apparatus 16 for use in characterizing the quality of semiconductor material. FIG. 3 shows a cross-section of the semiconductor/insulator structure 18 for which C-V measurements are to be made by characterizing apparatus 16 and by the characterizing method described herein.

More particularly, apparatus 16 includes low frequency C-V measuring system 20 connected to capacitor 22 and electrically thin semiconductor film 24 by capacitor contact 26 and semiconductor film contact 28. As seen in FIG. 3, semiconductor device 18 includes capacitor 22, such as a Metal Oxide Semiconductor (MOS) capacitor, constructed of upper layer 26 of any suitable type of electrical conductor material, such as aluminum or doped polysilicon, middle layer 30 of an insulator material, such as silicon dioxide or silicon nitride, and lower layer 24 of an electrically thin semiconductor material, such as a thin film of silicon, germanium or gallium arsenide. Semiconductor structure 18 also includes insulating substrate 32, composed of a material such as sapphire ($Al_2O_3$) or quartz ($SiO_2$), which mounts layers capacitor 22. Insulating substrate 32 is usually much thicker than upper, middle and lower layers 26, 30 and 24 making up capacitor 22 such that for purposes of analysis provided below substrate 32 is assumed to be infinitely thick.

Figure 4:
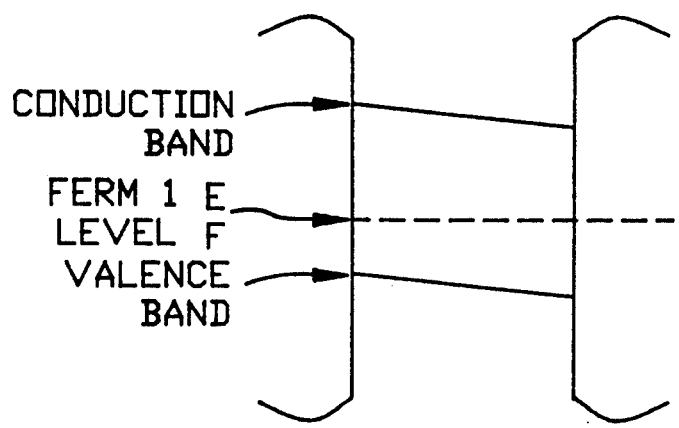
FIG. 4 is a simplified band diagram illustrating the relationship of conduction and valence bands to Fermi level in an electrically thin semiconductor film.

As seen in FIG. 2, electrical contact 28 of electrically thin semiconductor film 24 is grounded and thus for low frequencies holds the Fermi level of the semiconductor material constant everywhere in capacitor 22. FIG. 4 is a simplified band diagram illustrating the relationship of conduction and valence bands to the above-mentioned Fermi level in a semiconductor material layer of an electrically thin semiconductor film on an insulator. As is well-known, the conduction band is the level of energy required for electrons to be free in the crystalline structure of and thus available for conducting electricity. The valence band is the level of energy required to retain electrons within the crystalline structure of semiconductor in non-conducting valence bonds about the nucleus where they are not free to conduct electricity. There is a gap G between these two energy levels. The Fermi level, $E_F$, is a derived number which tells how many electrons are in the conduction band compared to the valence band. If the Fermi level is close to the conduction band, then there are numerous electrons available for conducting electricity. Conversely, if the Fermi level is close to the valence band, then more electrons are trapped at the valence sites and are not available for conducting electricity.

Analysis of Capacitance and Voltage Relationship

Given the construction of semiconductor structure 18 of FIGS. 2 and 3, coupled with the fact that it is possible to hold the Fermi level at zero with respect to substrate contact 28, the following condensed analysis is possible. First, the definitions of variables used herein are as follows:

$C_m$ = measured capacity
$C_{ox}$ = capacitor insulator (oxide) capacity
$C_t$ = series capacity of capacitor semiconductor and insulator layers
$\phi_c$ = potential edge of conduction band states
$\phi_v$ = potential edge of valence band states $Q_{sb}$=fixed charge of interface of substrate layer and capacitor semiconductor layer
$Q_t$=total charge in capacitor, including its interfaces
$N_{sb}$=density of states at interface of substrate layer and capacitor semiconductor layer
q=charge on electron
$\phi_b$=potential at interface of substrate layer and capacitor semiconductor layer
$\phi_s$=potential at interface of capacitor semiconductor and insulator layers
$\epsilon_{si}$=dielectric constant of semiconductor (silicon) layer
E(x)=electric field at a point x
$E_B$=electric field at interface of substrate layer and capacitor semiconductor layer
$\beta = (1/(26 \times 10^{-3})$ volts=q/kT
$t_{epi}$=thickness of capacitor semiconductor layer
$Z_s = e^{\beta \phi_s}$
$Z_b = e^{\beta \phi_b}$
$N_c$=density of conduction band states
$N_v$=density of valence band states
$a = \epsilon_{si} \beta E_b^2/2/q/N_c/\exp(-\beta \phi_c) - \exp(\beta \phi_b)$ Using Kirchoff's law, the definition of capacitance and a total differential, the following is true:

$$1/C_m = 1/[(\alpha Q_t/\alpha \phi_s) + (\alpha Q_t/\alpha \phi_b)(d\phi_b/d\phi_s)] + 1/C_{ox} \quad (1)$$

Assuming that voltage is measured from mid-gap to the Fermi level, the following is true from Gauss's law:

$$Q_{sb} - q \int_{\phi_v}^{\phi_b} N_{sb}(\phi) d\phi = -\epsilon_{si} E_b \quad (2)$$

Assuming that the capacitor semiconductor layer is lightly P-type, Poisson's equation in the semiconductor layer reduces to $$d^2\phi/dx^2 = +q/\epsilon_{si} N_c \exp[-q(\phi_c - \phi)/kT]. \quad (3)$$

It can be easily shown that $$E(\phi)^2 - E(\phi_b)^2 = \left[ 2q/\epsilon_s \int_\phi^{\phi_b} \rho(\phi) d\phi \right]. \quad (4)$$

Let $c = t_{epi}[2q/\epsilon_{si}/\beta N_c \exp(-\beta \phi_c)^{\frac{1}{2}}]. \quad (5)$ with $\beta = 1/kT$. \quad (6)

Equation 4 is now solved for $E(\phi)$ and is found to be $$E(\phi) = +/- \{(c/t_{epi})^2 \cdot [\exp(\beta \cdot \phi) - \exp(\beta \cdot \phi_b)] + E_b^2\}^{\frac{1}{2}}. \quad (7)$$

In order to find the complete solution the boundary condition that $\phi(x=0) = \phi_s$ is imposed. This is done by using the fact that the relationship $$d\phi/dx = -E(\phi) \quad (8)$$

can be used to rewrite equation 7 into the form $$\int_{\phi_s}^{\phi_b} \{(c/t_{epi})^2 \cdot [\exp(\beta \cdot \phi) - \exp(\beta \cdot \phi_b)] + E_b^2\}^{-\frac{1}{2}} d\phi = t_{epi}. \quad (9)$$

Equation 9 states that the integral of Equation 8 from the top of the epi-film to the back of the film must be equal to the film thickness. The integral can solved by making the following substitutions;

$$z = \exp(\beta \phi) \quad (10)$$

and $$a = \epsilon_{si} \beta E_b^2/2/q/N_c/\exp(-\beta \phi_c) - \exp(\beta \phi_b). \quad (11)$$

By substituting Equation 10 and 11 into Equation 9 one arrives at $$\int_{z_s}^{z_b} (z + a)^{-\frac{1}{2}}/z \, dz = c. \quad (12)$$

which has two solutions depending one whether a is positive or negative. These solutions are:

for $a < 0$, $\phi_s = 1/\beta \log_e(-af_1^2/f_2^2 - a)$ \quad (13)
with $f_1 = \{-[a + \exp(\beta \phi_b)]/a\}^{\frac{1}{2}} + \tan[c (-a)^{\frac{1}{2}}/2]$
and $f_2 = 1 - \{[a + \exp(\beta \phi_b)]/a\}^{\frac{1}{2}} \tan[c (-a)^{\frac{1}{2}}/2]$ for $a > 0$, $\phi_s = 1/\beta \log_e(ag_1^2/g_2^2 - a)$ \quad (14)
with $g_1 = [1 + \exp(\beta \phi_b)]/a]^{\frac{1}{2}} + 1 +$
$\{[1 + \exp(\beta \phi_b)]/a]^{\frac{1}{2}} - 1\} \exp(-ca^{\frac{1}{2}})$
and $g_2 = [1 + \exp(\beta \phi_b)]/a]^{\frac{1}{2}} + 1 -$
$\{[1 + \exp(\beta \phi_b)]/a]^{\frac{1}{2}} - 1\} \exp(-ca^{\frac{1}{2}})$ $Q_t$ can now be found from Gauss' Law and is $$Q_t = -E(\phi_s)/\epsilon_{si}. \quad (15)$$

Using equations 1, 2, 11, 13 and 14 complete, closed formed solutions, showing the relationship of capacity and voltage of a lightly doped semiconductor layer have been found. Two very important limiting cases follow immediately. Whether or not the semiconductor is lightly doped, by using Gauss's law it can be shown that when the semiconductor film is completely depleted out $$(dV_g/d\phi_b) = qN_{sb}(\phi)/C_m) \quad (16)$$

$$qN_{sb} = C_m/(1 - C_m/C_t) \quad (17)$$

The critical parameters that are to be measured are $Q_{sb}$ and $N_{sb}$. $Q_{sb}$ is the fixed charge at the interface of the substrate layer and the capacitor semiconductor layer. $N_{sb}$ s is the interface state density at the interface of the substrate layer and the capacitor semiconductor layer.

The characterization of the electrically thin film semiconductor by the C-V technique of the present invention has a distinct advantage over the prior art C-V technique in that the analysis covers the cases where there is no depletion edge in the film. Also this analysis results in solutions from strong inversion to strong accumulation with very simple relationships in the depletion case. These solutions allow quick inspection of thin semiconductor films in an integrated circuit foundry environment which up to now has not been possible.

Techniques and Procedures

Capacitance Measurement

Figure 5:
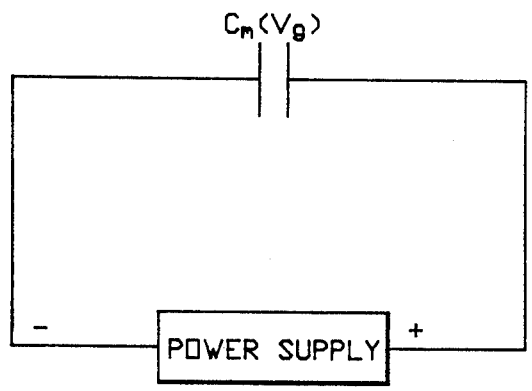
FIG. 5 is a symbolic diagram of a biased capacitor.

The capacitor used in the characterizing method of the present invention is preferably a two-terminal device. FIG. 5 shows a simple diagram of a capacitor $C_m(V_g)$ which is a MOS capacitor with its gate biased by a power supply at voltage $V_g$. To determine the capacity of such a device the definition $$C_m(V_g) = dQ/dV_g \qquad (17)$$

was used. In Equation (17) it is emphasized that $C_m$ is a function of $V_g$ and Q is the total charge in the capacitor. Typically the gate voltage is modulated by a small sinusoidal voltage such as $$V_g(t) = V_g + V_o \sin(2\pi ft) \qquad (18)$$

where t is time, and f is the frequency and $V_o$ is the amplitude of the a.c. signal. Thus $$dQ/dV_g = (dQ/dt)(dt/dV_g) \qquad (19)$$
$$= I_c(t)[2\pi fV_o\cos(2\pi ft)]^{-1}$$

where $I_c$ is the instantaneous current in the capacitor. An important assumption now made is that the capacity is constant in the sampling range $$(V_g - V_0) < or = V_g(t) < or = (V_g + V_0).$$

Since the current in a fixed capacitor must be $\pi/2$ radians out of phase with the driving signal, Equation (19) reduces to $$C_m(V_g) = I_{90}(V_g)/(2\pi fV_0) \qquad (20)$$

where $I_{90}$ is the out-of-phase current and is a function of $V_g$.

Figure 6:
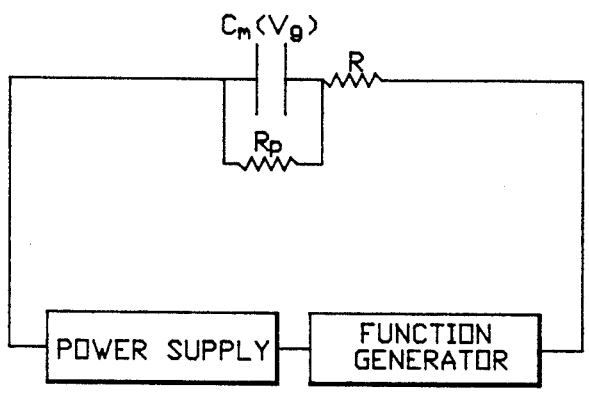
FIG. 6 is a general diagram of a biased capacitor with a resistor in series and parallel.

A more realistic perspective of the thin film capacitor is shown in FIG. 6. In this diagram, a voltage controlled capacitor $C_m(V_g)$ has resistor $R_p$ in parallel and resistor R in series with a power supply and a function generator. Typical oxides have a net resistance greater than $10^{15}$ ohms for a 5 picofarad capacitor. The time constant associated with that value is greater than $10^3$ seconds. Thus for sampling frequencies greater than 0.1 hertz, parallel resistor $R_p$ can be ignored. However, for thin film devices and/or very high frequencies, series resistor R can force the current in Equation (19) to some phase other than $\pi/2$, thus making a correction necessary Assuming the a.c. amplitude, $V_0$, is small, a simple a.c. analysis can be used to solve for R and C in FIG. 6. These calculated values for R and C are $$R = I_0[1 + (2\pi fRC)^2]/(2\pi fC)^2/V_0 \qquad (21)$$

$$C = I_{90}[1 + (2\pi fRC)^2]/(2\pi fV_0). \qquad (22)$$

$I_0$ and $I_{90}$ are the in-phase and out-of-phase amplitudes of the peak current. The effect of R on the measurement of C can now be evaluated. Inspection of Equation (22) shows that for $2\pi fRC < or = 0.1$ only a 1% or less error on the measurement of C will result from the presence of R in using Equation (21).

Figure 7:
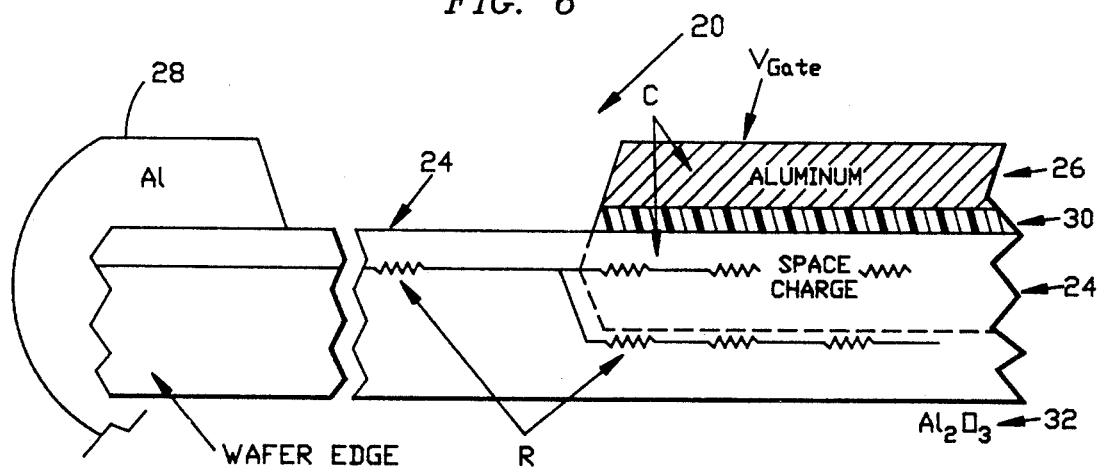
FIG. 7 is a diagrammatic sectional view of the sample capacitor and substrate contact.

A still more realistic perspective on a typical thin film capacitor $C_m(V_g)$s which may be used is shown by way of example in FIG. 7. As shown in FIG. 7, the resistance is distributed and thus Equations (21) and (22) may not apply. The validity of using the criteria $2\pi fRC < 0.1$ to allow the use of Equations 21 and 22 to calculate the capacitance for a circular capacitor is now addressed.

Figure 11:
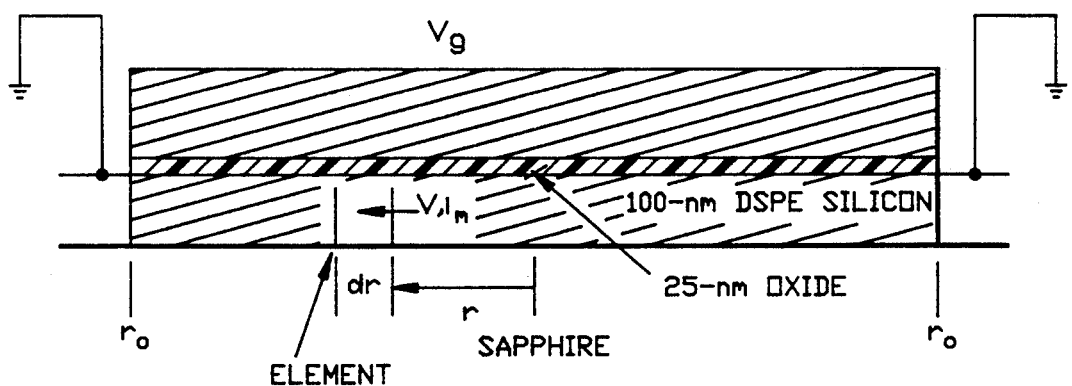
FIG. 11 is a cross section of a circular capacitor illustrated by way of example.

By way of example, the cross section of a circular capacitor is shown in FIG. 11. The thickness of the film shown in FIG. 11 is exaggerated. The periphery of the device may be held at ground potential and the gate electrode at $V_g$. A small a.c. signal, $V_{ac}$, is then added to $V_g$ and is expressed by $$V_{ac} = V_0 \exp(2\pi jft), \qquad (23)$$

where $V_0$ is the amplitude of the signal, $j = (-1)^{\frac{1}{2}}$, f is the frequency and t is time. For example $V_0 = 10–25$ mV.

Since the resistance and capacitance of this structure are distributed, a differential equation must be derived to describe the current flow caused by the applied alternating voltage. FIG. 11 shows a small element under the gate oxide of length dr. The current and the voltage in this element are related by the following equations $$\nabla \cdot i = c \, dV/dt \qquad (24)$$

and $$\nabla V = \rho i, \qquad (25)$$

where i is the current in the element, r is the distance along the device, c is the capacitance per unit area, $\rho$ is the sheet resistance, assumed nearly constant, V is the voltage at the element, and t is time. Substituting Equation (25) into Equation (24) gives the diffusion equation which is written as $$\nabla V^2 = \rho c \, dV/dt. \qquad (26)$$

The boundary condition associated with Equation (26) is $$V(r,t) = V_0 \exp(2\pi jft) \text{ at } r = r_o, \qquad (27)$$

where $r_o$ is the radius of the circular capacitor.

The solution to Equation (26) with the boundary condition stated in Equations (27) is $$V(r,t) = V_0 \exp(2\pi jft) J_o(\lambda r)/J_o(\lambda r_o) \qquad (28)$$

where $$\lambda = (2\pi jfcp)^{\frac{1}{2}}. \qquad (29)$$

The measured current, $i_m(t)$ can now be found from Equations (29), (28), and (24); and is $$i_m(t) = 4\pi^2 jfc \int_0^{r_o} V(r,t) r \, dr. \qquad (30)$$

Integrating Equation (30) gives $$i_m(t) = 4\pi^2 r_o jfc V_0 \exp(2\pi jft) J_1(\pi r_0)/J_o(\pi r_0)/\pi \qquad (31)$$

The Bessel function terms in Equation (31) are now expanded about $\lambda r_o$ with terms containing $(\lambda L)^6$ or higher being left out. After this expansion and some algebra, Equation (31) reduces to $$i_m(t) = 2\pi^2 r_o^2 jfc V_0 \exp(2\pi jft)$$
$$[1 + \tfrac{1}{4}(\lambda r_o/2)^2 + \tfrac{1}{4}(\lambda r_o/2)^4] \qquad (32)$$

Thus equating $\rho/(8\pi)$ and $\pi r_o^2 c$ with R and C in Equations 21 and 22 and FIG. 6, it is now clear that if $$2\pi fRC < 0.1 \tag{33}$$

then $$\tfrac{1}{4}(\lambda r_o/2)^4 < 0.0133 \tag{34}$$

Thus, when the criterion in Equation 32 is met, Equation 32 can be written to an accuracy of 1.3% as $$i_m(t) = 2\pi^2 r_o{}^2 ifc V_0 exp(2\pi jft)(1 - j\pi r_o{}^2 cpf/4) \tag{35}$$

thus establishing that the series resistance and capacitance can be considered lumped for the device used in this technique, provided that $2\pi fRC < 0.1$.

Low Frequency C-V Techniques

Figure 8:
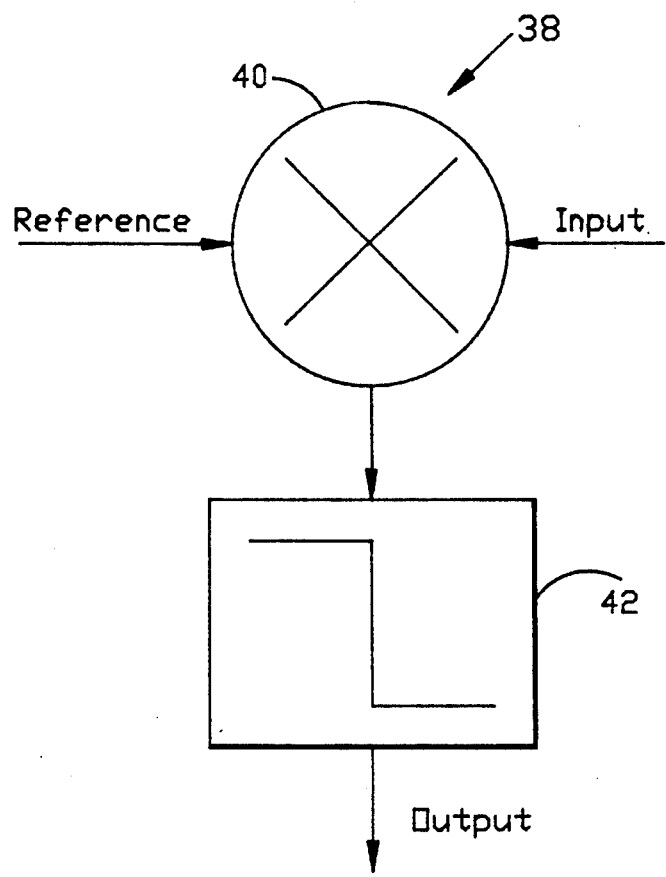
FIG. 8 is schematic diagram of a basic lock-in amplifier.

In the previous section it was shown that the capability of measuring in-phase and out-of-phase components of a capacitor's response to a small sinusoidal driving signal is very important in determining the capacity. This measurement can be accomplished using lock-in amplifier 38 schematically illustrated in FIG. 8. The basic components of lock-in amplifier 38 are mixer 40 and low pass filter 42. Mixer 40 mixes a reference signal from a local oscillator (not shown) and an input signal to produce an intermediate output signal which includes the sum and difference of the frequencies of the reference and input signals. The intermediate output signal then passes through low pass filter 42 which filters out nearly all a.c. components. Thus the d.c. level at the filter 42 output will be proportional to the product of the reference and input signal amplitudes at frequency f.

Lock-in amplifier 38 also includes a phase shifter (not shown) so that the phase of the reference signal relative to the input signal can be changed. It is to be understood that it is within the scope of the present invention that components other than lock-in amplifier 38 could be utilized to implement its function such as any phase sensitive amplifier. This allows the measurement of the in-phase and out-of-phase components of the input signal. By the appropriate filter choice, a.c. noise in the system can be reduced or eliminated by using the lock-in amplifier.

Figure 9:
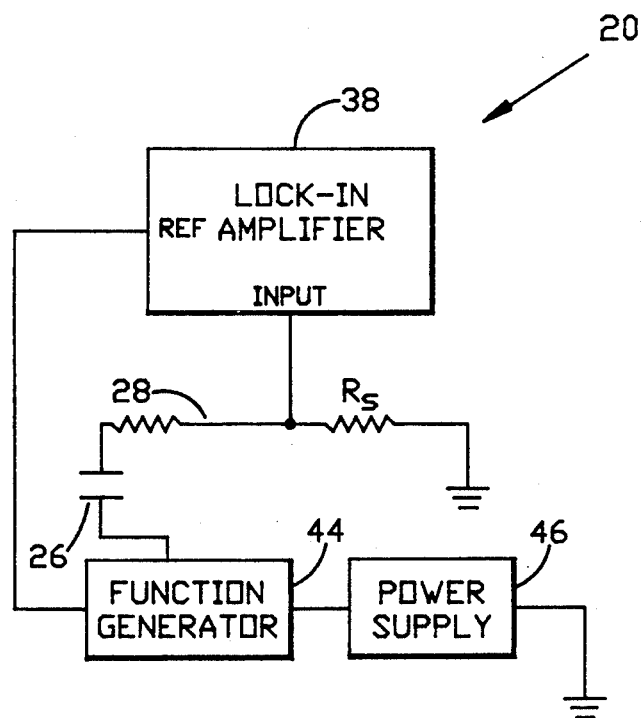
FIG. 9 is a general diagram of a circuit using the lock-in amplifier to measure capacitance.

Referring to FIG. 9, lock-in amplifier 38 is shown being used to measure resistor R and capacitor $C_m$ in series. Function generator 44 is connected to power supply 46 and drives the portion of the circuit containing capacitor $C_m$ and resistor R with a small amplitude sinusoidal signal. This same function generator produces the reference signal at one input (e.g. Ref.) to lock-in amplifier 38 which is exactly in-phase with the driving signal. Sense resistor $R_m$ is placed in series with $C_m$ and R. The value of $R_s$ is $<< 1/(2\pi fC)$. The voltage drop across $R_s$ is the other input (e.g Signal) to lock-in amplifier 38.

To measure the in-phase component, the reference signal is mixed with the input signal and then passed through the low pass filter. $V_{out}$ is then proportional to the in-phase component of the current in the circuit as discussed in the previous section. The reference is then shifted by $\pi/2$. Now $V_{out}$ is proportional to the out-of-phase component of the circuit. Equations (21) and (22) may then be used to measure $C_m$ and R.

Figure 10:
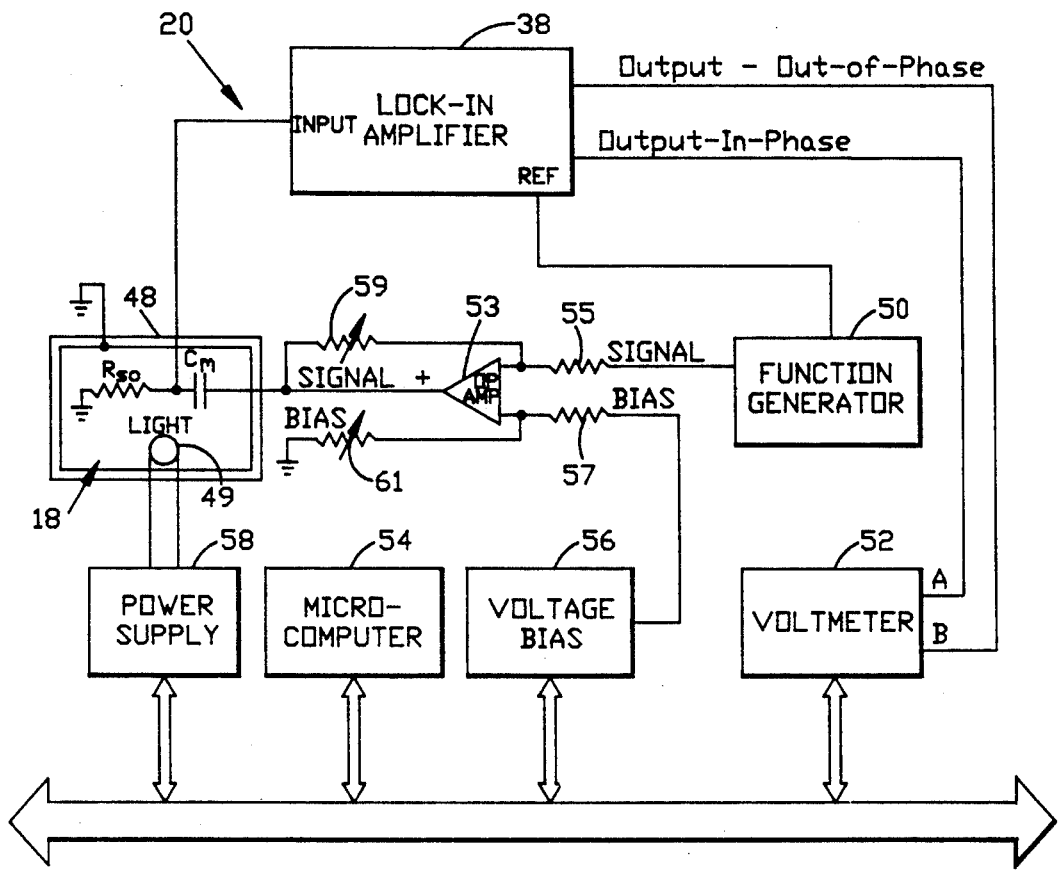
FIG. 10 is a detailed diagram of the apparatus used in the present invention to measure capacitance.

FIG. 10 illustrates by way of example a system that may be used in the performance of the present invention. Semiconductor devices to be qualified are contained and probed in metal light-tight box 48. Box 48 is grounded, as is the outside of all coaxial cables connecting the various pieces of equipment. Holes and electrons are produced on the perimeter of the device by turning light 49 in box 48 "on" then "off" before each measurement. This ensures that capacitor $C_m$ is in d.c. equilibrium after each bias change. If the light is used during the experiment it must be only bright enough such that Equation (33) is satisfied during the measurement. Too bright a light can produce errors in the measurement if too much is coupled into the area under the capacitor. The d.c. bias is provided by bias function generator 56 while an a.c. modulation is provided by function generator 50 which also provides the reference signal for lock-in amplifier 38 The d.c. bias and the a.c. modulation are added together by operational amplifier 53 whose output is the stimulus for the test capacitor. This is desirable since a function generator with its own internal d.c. bias often has the phase difference between it output and trigger as a function of this bias. By summing the a.c. and d.c. components through operational amplifier 53 this problem is solved. Resistors 55, 57, 59, and 61 are for adjusting the gain and offset of operational amplifier 56. Their absolute values are preferably chosen such that they are much less than the input impedance of the operational amplifier. Their relative values are chosen to give the voltage swing the user needs for the gate voltage. The output of lock-in amplifier 38 is sensed by external voltmeter 52. Voltmeter 52 is used in the present example since lock-in amplifier 38 can not be used on the instrument bus 63 which in the present example is an IEEE-488 bus Thus the analog output of lock-in amplifier 53 is accessed by the computer via a voltmeter that can communicate with bus 63. Microcomputer 54 is used to control voltage bias function generator 56, power supply 58 for light 49, and voltmeter 52. This is done over instrument bus 63. Under the control of a software computer program commands to these three devices can be sent. Information can also be transferred to the computer over this bus from the voltmeter. Thus, all data is stored in a convenient format on a computer floppy disc, allowing easy data manipulation and retrieval. By way of example, commercially-available components that may be used are as follows: an Ithaco 393 Lock-In Amplifier as lock in amplifier 38; a Tektronix AM501 operational amplifier as operational amplifier 53; a Wavetek 182 Function Generator as function generator 50; a Keithy 619 Electrometer as voltmeter 52; an IBM Personal System/2 Model 50 Computer as microcomputer 54; a Tektronix 5010 Function Generator as voltage bias function generator 56; and a Tektronix 5010 Power Supply as power supply 58. A source code listing written in Quick Basic suitable for implementation as the source code for computer 54 is provided by way of example in the following pages.

It is thought that the present invention and many of its attendant advantages will be understood from the description herein and it will be apparent that various changes may be made in the form, construction and arrangement of the parts thereof without departing from the spirit and scope of the invention or sacrificing all of its material advantages, the forms hereinbefore described being merely exemplary embodiments thereof.

Navy Case No. 70448

```
DECLARE SUB menu14 ()
'******************************************************************
' program station1.bas
'******************************************************************
DECLARE SUB filter (buffer$)              ' filters output of HP4145.
DECLARE SUB qplot4145 ()                  ' turn plot control to panel.
DECLARE SUB measA ()                      ' menu selection of 'measurements'.
DECLARE SUB measB ()                      ' menu selection of 'measurements'.
DECLARE SUB measC ()                      ' menu selection of 'measurements'.
DECLARE SUB measD ()                      ' menu selection of 'measurements'.
DECLARE SUB measE ()                      ' menu selection of 'measurements'.
DECLARE SUB measY ()                      ' menu selection of 'measurements'.
DECLARE SUB measZ ()                      ' menu selection of 'measurements'.

DECLARE SUB measurements ()               ' HP4145 measurements 'ParamAn'.
DECLARE SUB gpwait (mask!, PR)            ' gpib wait routine.
DECLARE SUB srqchk ()                     ' polls GPIB devices for SRQ.
DECLARE FUNCTION byte$ (i!)               ' converts number to binary rep.
DECLARE SUB ChParams ()                   ' change values in CapRes.
DECLARE SUB capres ()                     ' measure cap and res values.
DECLARE SUB menu1 ()                      ' menu line 1 for CapRes.
DECLARE SUB menu2 ()                      ' menu line 2 for CapRes.
DECLARE SUB menu3 ()                      '    "     "   3  "    "
DECLARE SUB menu4 ()                      '    "     "   4  "    "
DECLARE SUB menu5 ()                      '    "     "   5  "    "
DECLARE SUB menu6 ()                      '    "     "   6  "    "
DECLARE SUB menu7 ()                      '    "     "   7  "    "
DECLARE SUB menu8 ()                      '    "     "   8  "    "
DECLARE SUB menu9 ()                      '    "     "   9  "    "
DECLARE SUB menu10 ()                     '    "     "  10  "    "
DECLARE SUB menu11 ()                     '    "     "  11  "    "
DECLARE SUB menu12 ()                     '    "     "  12  "    "
DECLARE SUB menu13 (answer$)              '    "     "  13  "    "
DECLARE SUB PlotPt (voffset!, r!, c!)     ' plot data in CapRes.
DECLARE SUB PlotAxes ()                   ' plot axes in CapRes.
DECLARE SUB menu0 (a$)                    ' main menu in CapRes.
DECLARE SUB save4145 ()                   ' save file on HP4145.
DECLARE SUB get4145 ()                    ' get file on HP4145.
DECLARE SUB download ()                   ' download file from HP4145.
DECLARE SUB plot4145 ()                   ' plot data from HP4145 to plotter.

DECLARE SUB ParamAn ()                    ' run HP4145.
DECLARE SUB pause (seconds%)              ' delays 'seconds%' seconds.
DECLARE SUB menu ()                       ' main menu for entire program.
DECLARE SUB CurrMeas (select$, amps!)     ' measure current Keithly 619.
DECLARE SUB VoltMeas (select$, volts!)    ' measure voltage Keithly 619.
DECLARE SUB checkerror (sub$, device$)    ' check gpib status.
DECLARE SUB gpib (arg$, PR)               ' gpib bus commands.
DECLARE SUB CurrOut (iout!)               ' set current supply.
DECLARE FUNCTION spoll% (dev$, PR)        ' serial poll of device.
```

```
DECLARE SUB general ()                          ' general gpib communications.
DECLARE SUB send (device$, instruct$, PR)        ' send instruct$ to device$.

DECLARE SUB receive (device$, data$, count%, PR) ' read count% characters into
                                                 ' data$ from device$.
DECLARE SUB initgpib ()                          ' initialize gpib bus, devices.

DECLARE SUB status (stat%, stat$)                ' get status of gpib controller ' returns code in stat% and
                                                 ' mnemonics in stat$.
DECLARE SUB Capmm ()
DECLARE SUB conmm ()
DECLARE SUB opemm ()
DECLARE SUB scan26 (noc, relay)
DECLARE SUB scanc ()
DECLARE SUB capint ()                            ' intitializes constants
DECLARE SUB meamm ()                             'This sub performs the meas.
DECLARE SUB strmm ()                        'This sub sets up the stress parameters DECLARE SUB stage ()              'This sub controls the hot stage
' Test station control program
'       This program controls several instruments used in the measurement
'       lab.  The instruments are connected to the computer by a National
'       Instruments GPIB-232CT controller, communicating via GPIB bus to
'       the controller and via RS-232 between the controller and the
'       the computer.  There are several general purpose procedures in
'       the program which are useful in simplifying communication with
'       the instruments.  These procedures can easily be found by using
'       the QuickBasic "View Sub" command (alt+V S or F2 key).  The
'       descriptions of these routines should be in the manual.
' The following 'DIM SHARED' statements allow all procedures access to
' the GPIB address strings for the devices on the bus.
CLEAR
DIM SHARED hp4145$, plot$, went$, k224$, k619A$, k619B$, ps5010$, fg5010$
DIM SHARED si5010$, comm$, swit$, am501$, stag$, livolt ' The following global variables are used in the CapRes subprogram.
DIM SHARED f$, vgmin, vgmax, dvg, sens, delay, freq, r0, v0, rmax, cmax
DIM SHARED light$, r2#(19), c2#(19), con(16), ope(16), bscale
' The following global variables are used in the stress subprogram
DIM SHARED str(16)
'Devices on the bus - Check that these are correct addresses
hp4145$ = "16"   ' HP parameter analyzer
plot$ = "10"     ' HP Colorpro plotter            dummy
stag$ = "5"      ' Micromanipulator hot stage
k224$ = "19"     ' Keithley 224 current source
k619A$ = "6+1"   ' Keithley 619 multimeter channel A
k619B$ = "6+2"   ' Keithley 619 multimeter channel B
ps5010$ = "22"   ' Tektronix PS5010 power supply
fg5010$ = "24"   ' Tektronix FG5010 function generator
si5010$ = "26"   ' Tektronix SI5010 scanner
comm$ = "17"     ' Custom made commutator
swit$ = "18"     ' Custom made switcher
am501$ = ""      ' Tektronix AM501 operational amplifier
```

```
'*****************************************************************
' main program loop
CLS                           ' clear the screen for start of program.
CLOSE
OPEN "com1:9600,n,7,1" FOR RANDOM AS #1   ' open serial port.
initgpib                      ' initialize bus and instruments.
menu                          ' bring up program menu.
CLOSE                         ' close all files and devices before exiting.
END                           ' self explanatory.

'*****************************************************************

'*****************************************************************

' This routine prints out ascii codes for all characters in a string
'*****************************************************************

SUB ascstr (nstr$)
  PRINT "ASCII '";
  FOR i = 1 TO LEN(nstr$)              ' loop thru entire string
    PRINT ASC(MID$(nstr$, i, 1));      ' convert char to ascii code
  NEXT i
  PRINT
END SUB '*****************************************************************
' This routine converts an integer (0 to 255) into a string of 0's and
' 1's giving the binary representation of the integer.
'*****************************************************************
FUNCTION byte$ (i)
  i = INT(i)                           ' make sure we have an integer.
  a$ = ""
  IF i >= 0 AND i <= 255 THEN          ' make sure it's in range.
    IF (i AND 128) <> 0 THEN a$ = a$ + "1" ELSE a$ = a$ + "0"
    IF (i AND 64)  <> 0 THEN a$ = a$ + "1" ELSE a$ = a$ + "0"
    IF (i AND 32)  <> 0 THEN a$ = a$ + "1" ELSE a$ = a$ + "0"
    IF (i AND 16)  <> 0 THEN a$ = a$ + "1" ELSE a$ = a$ + "0"
    IF (i AND 8)   <> 0 THEN a$ = a$ + "1" ELSE a$ = a$ + "0"
    IF (i AND 4)   <> 0 THEN a$ = a$ + "1" ELSE a$ = a$ + "0"
    IF (i AND 2)   <> 0 THEN a$ = a$ + "1" ELSE a$ = a$ + "0"
    IF (i AND 1)   <> 0 THEN a$ = a$ + "1" ELSE a$ = a$ + "0"
    byte$ = a$                                              ' return.
  ELSE
    byte$ = "byte$ - argument out of range"                 ' not in range.
  END IF
END FUNCTION SUB capint
'*****************************************************************
' This program initializes the constants used in capres
'*****************************************************************
  f$ = "test"                    ' data file name.
  vgmin = -5                     ' starting gate voltage.
  vgmax = 5                      ' ending gate voltage.
  dvg = .1                       ' gate voltage step.
  sens = .0003125#               ' lock-in sensitivity.
  delay = 5                      ' delay between readings.
  freq = 10                      ' measuring frequency for capacitance.
```

```
    r0 = 998000                    ' reference resistor.
    v0 = .05                       ' reference voltage.
    rmax = 4000                    ' resistance plotting scale.
    cmax = 300                     ' capacitance plotting scale.
    light$ = "yes"                 ' turn light on.
    livolt = 3                     ' light voltage.
    bscale = 2000!                 ' full scale of the boonton
    str(2) = 25                    'Low temperature of stress bias
    str(3) = 250                   'High temperature of stress bias
    str(4) = 5                     'Soak time of stress bias
    str(5) = 15                    'Maximum allowed time to cool down
    str(6) = 5                     'Positive stress 666=no
    str(7) = -5                    'Negative stress 666=no
END SUB SUB Capmm
'**************************************************************
'This subroutine prints out the menu for capacitor main menu
'**************************************************************
DIM a$(20)
 ns = 6
a$(1) = "Control"
a$(2) = "Setup Menu"
a$(3) = "Operation Selection"
a$(4) = "Measure"
a$(5) = "Stress Setup"
a$(6) = "Back to Main Station Menu"
DO
CLS
SCREEN 0
LOCATE 1, 30
COLOR 7, 1
PRINT "Capacitor Main Menu"
COLOR 7, 0
FOR i = 1 TO ns
LOCATE (2 + i * 2), 20
PRINT a$(i)
NEXT i
DO
i = 1
        DO
        LOCATE (2 + i * 2), 18
        COLOR 7, 4
        PRINT "O"
                DO
                tmp$ = INKEY$
                LOOP UNTIL tmp$ <> ""
        LOCATE (2 + i * 2), 18
        COLOR 7, 0
        PRINT " "
        i = i + 1
        LOOP UNTIL tmp$ = "s" OR i = ns + 1
LOOP UNTIL tmp$ = "s"
IF i = 2 THEN conmm
IF i = 3 THEN menu0 (a$)
IF i = 4 THEN opemm
IF i = 5 THEN meamm
IF i = 6 THEN strmm
LOOP UNTIL i = ns + 1 AND tmp$ = "s"
END SUB
```

```
'*********************************************************************
' This routine measures the capacitance and resistance values for
' capacitors as a function of applied gate voltage.  The values are
' plotted on the screen in real time and saved to a disk file also.
'*********************************************************************
SUB capres
    fil$(1) = "O"
    fil$(2) = "P"
    fil$(3) = "N"
    cont(2) = con(2)                        'Remember the status of control
    cont(3) = con(3)
    con(2) = 0                              'Prepare for measurement
    con(3) = 0
js = 1
DO
IF ope(2) = 1 THEN
    con(2) = 1                              'Low-Frequency Measurement
    scanc
    OPEN "O", #2, f$ + fil$(js) + "L.DAT"       ' proceed with measurement
    CALL send(fg5010$, "AMPL " + STR$(0) + ";", 0)     ' set FG amplitude.
    CALL send(fg5010$, "FREQ " + STR$(freq) + ";", 0) ' set FG frequency.
    CALL send(fg5010$, "OUT ON;", 0)                   ' turn FG output on.
    PRINT #2, vgmin, vgmax, freq                       ' print to data file.
    voffset = vgmin DO
        CALL send(fg5010$, "OFFS " + STR$(voffset / 2) + ";", 0)' gate voltage.

IF light$ = "yes" THEN
            CALL send(ps5010$, "VPOS " + STR$(livolt) + ";FSOUT ON;", 0) ' on.
            t = TIMER
            DO
            LOOP UNTIL TIMER - t >= 2                          ' wait 2 seconds.
            CALL send(ps5010$, "VPOS " + STR$(0) + ";FSOUT ON;", 0)  ' off.
        END IF
        t = TIMER
        DO
        LOOP UNTIL TIMER - t >= delay                      ' wait delay seconds.
        CALL VoltMeas("A", volts)                          ' measure in-phase signal.

p = 2 * 2 ^ .5 * volts * sens / 10                 ' resistive part.
        CALL VoltMeas("B", volts)                          ' measure out-phase signal.

q = 2 * 2 ^ .5 * volts * sens / 10                 ' reactive part.
        PRINT #1, "SIC SRE"                                ' GPIB IFC and REN.
        IF (p * p + q * q) > 0 THEN
            r = r0 * v0 * p / (p * p + q * q) / 1000000    ' resistance in meg's.

x = r0 * v0 * q / (p * p + q * q)              ' reactance in ohms.
            c = 1 / (2 * 3.1415927# * freq * x) * 1E+12    ' capacitance in pf.
        END IF
        COLOR 1, 0
        LOCATE 25, 5
        PRINT USING "Voffset = ##.## volts"; voffset;      ' display data as
        PRINT USING "        R =####.## Meg-ohms"; r;      ' acquired.
        PRINT USING "        C =####.## pf"; c;
        PRINT #2, voffset, r, c                            ' save in file.
        CALL PlotPt(voffset, r, c)                         ' plot on screen.
        voffset = voffset + dvg
```

```
      LOOP UNTIL (voffset > vgmax) OR (INKEY$ = CHR$(27))
      CLOSE #2                                          ' close data file.
      con(2) = 0
   END IF
IF ope(3) = 1 THEN
      con(3) = 1                            'High-Frequency Measurement
      scanc
      OPEN "O", #2, f$ + fil$(js) + "H.DAT"        ' proceed with measurement CALL send(fg5010$, "AMPL " + STR$(0) + ";", 0)    ' set FG amplitude.
      CALL send(fg5010$, "FREQ " + STR$(freq) + ";", 0) ' set FG frequency.
      CALL send(fg5010$, "OUT ON;", 0)                  ' turn FG output on.
      PRINT #2, vgmin, vgmax, freq                      ' print to data file.
      voffset = vgmin DO
         CALL send(fg5010$, "OFFS " + STR$(voffset / 2) + ";", 0)' gate voltage.

IF light$ = "yes" THEN
            CALL send(ps5010$, "VPOS " + STR$(livolt) + ";FSOUT ON;", 0) ' on.
            t = TIMER
            DO
            LOOP UNTIL TIMER - t >= 2                      ' wait 2 seconds.
            CALL send(ps5010$, "VPOS " + STR$(0) + ";FSOUT ON;", 0)   ' off.
         END IF
         t = TIMER
         DO
         LOOP UNTIL TIMER - t >= 1               ' wait 1 seconds.
         CALL VoltMeas("B", volts)               ' measure out-phase signal.

PRINT #1, "SIC SRE"                     ' GPIB IFC and REN.
            c = bscale * volts * 1.022 / 2       ' capacitance in pf.
'           c = c - .00073 * (c) ^ 1.73'This is the correction factor for the
cables
         r = 0                                   'no series capacity
         COLOR 1, 0
         LOCATE 25, 5
         PRINT USING "Voffset = ##.## volts"; voffset;  ' display data as
         PRINT USING "        R =####.## Meg-ohms"; r;  ' acquired.
         PRINT USING "        C =####.## pf"; c;
         PRINT #2, voffset, r, c                 ' save in file.
         CALL PlotPt(voffset, r, c)              ' plot on screen.
         voffset = voffset + dvg
      LOOP UNTIL (voffset > vgmax) OR (INKEY$ = CHR$(27))
      CLOSE #2                                  ' close data file.
      con(3) = 0
   END IF
   DO
      IF ope(6) = 1 AND str(js + 5) <> 666 AND js <> 3 THEN
         CALL send(fg5010$, "OFFS " + STR$(str(js + 5) / 2) + ";", 0)' gate
voltage.
         con(4) = 1
         scanc
         stage
         con(4) = 0
      END IF
      js = js + 1
      LOOP UNTIL str(js + 4) <> 666 OR js = 4
LOOP UNTIL js = 4 OR ope(6) = 0
```

```
        con(2) = cont(2)
        con(3) = cont(3)
        scanc
        COLOR 7, 0
        LOCATE 4, 26
        PRINT "Finished - any key continues"
        DO
        LOOP UNTIL INKEY$ <> ""
        DO
        LOOP UNTIL INKEY$ = ""
END SUB '*********************************************************************
' This general purpose routine checks the status of the GPIB controller
' at any time it is called.  The argument 'sub$' should be the name of the
' procedure from which this routine is called (e.g. 'send,'receive'.  The
' argument 'device$' is the device being addressed.  The argument
' descriptions above are for the normal usage of this routine, but any
' strings could be inserted as the arguments
' (e.g. - CALL checkerror("test routine", "interface") ).
'*********************************************************************
SUB checkerror (sub$, device$)
    CALL status(stat%, stat$)        ' get status of controller, see if errors.
    IF stat% < 0 THEN                ' controller error indicated.
        PRINT
        PRINT UCASE$(sub$) + " - device " + device$ + " - errors occurred."
        PRINT stat$                  ' print status mnemonics
        PRINT
    END IF  ' stat%
    IF (stat% AND 4096) THEN         ' SRQ line active.
        CALL srqchk                  ' check all devices to find SRQ.
    END IF
END SUB '*********************************************************************
'   This routine allows one to change parameter values in the menu of the
'   CapRes subprogram.
'*********************************************************************
SUB ChParams
    LOCATE 20, 7
    COLOR 7, 1
    PRINT "Enter";
    COLOR 7, 0
    PRINT " the number /letter of the parameter you would like to change:";
    DO
        b$ = UCASE$(INKEY$)
        b = VAL(b$)
LOOP UNTIL (b >= 1 AND b <= 9) OR b$ = "R" OR b$ = "C" OR b$ = "L" OR b$ = "M"

COLOR 7, 1
PRINT b$
COLOR 7, 0
LOCATE 21, 7
PRINT "Enter the new value of the parameter and press";
COLOR 7, 1
PRINT "<return>":
COLOR 7, 0
LOCATE 20, 7
PRINT "Enter"
```

```
COLOR 7, 1
SELECT CASE b
  CASE 1
    CALL menu1
  CASE 2
    CALL menu2
  CASE 3
    CALL menu3
  CASE 4
    CALL menu4
  CASE 5
    CALL menu5
  CASE 6
    CALL menu6
  CASE 7
    CALL menu7
  CASE 8
    CALL menu8
  CASE 9
    CALL menu9
  CASE ELSE
    ' do nothing
END SELECT
SELECT CASE b$
  CASE "R"
    CALL menu10
  CASE "C"
    CALL menu11
  CASE "L"
    CALL menu12
  CASE "M"
    CALL menu14
  CASE ELSE
    ' do nothing
END SELECT
LOCATE CSRLIN, 53
PRINT "        ";
LOCATE CSRLIN, 53
INPUT "", p$
SELECT CASE b
  CASE 1
    f$ = p$
  CASE 2
    vgmin = VAL(p$)
  CASE 3
    vgmax = VAL(p$)
  CASE 4
    dvg = VAL(p$)
  CASE 5
    sens = VAL(p$) / 1000
  CASE 6
    delay = VAL(p$)
  CASE 7
    freq = 1000 * VAL(p$)
  CASE 8
    r0 = 1000 * VAL(p$)
  CASE 9
    v0 = VAL(p$) / 1000
```

```
      CASE ELSE
        ' do nothing
    END SELECT
    SELECT CASE b$
      CASE "R"
        rmax = VAL(p$)
      CASE "C"
        cmax = VAL(p$)
      CASE "L"
        light$ = LCASE$(p$)
      CASE "M"
        bscale = VAL(p$)
      CASE ELSE
        ' do nothing
    END SELECT
END SUB SUB commm
'***************************************************************
'This subroutine prints out the menu for control main menu
'***************************************************************
DIM a$(20)
CLS
ns = 3
a$(1) = "Capacitor Main Menu"
a$(2) = "Low-Frequency Connected"
a$(3) = "High-Frequency Connected"
LOCATE 1, 30
COLOR 7, 1
PRINT "Control"
COLOR 7, 0
FOR i = 1 TO ns
LOCATE (2 + i * 2), 20
PRINT a$(i)
NEXT i
scanc
DO
i = 1
        FOR j = 2 TO ns
        LOCATE (2 + j * 2), 18
        COLOR 7, 5
        IF con(j) = 1 THEN
        PRINT "X"
        ELSE
        COLOR 7, 0
        PRINT " "
        END IF
        NEXT j DO
        LOCATE (2 + i * 2), 14
        COLOR 7, 4
        PRINT "O"
                DO
                tmp$ = INKEY$
                LOOP UNTIL tmp$ <> ""
        LOCATE (2 + i * 2), 14
        COLOR 7, 0
```

```
        PRINT " "
        i = i + 1
        LOOP UNTIL tmp$ = "s" OR i = ns + 1
        IF tmp$ = "s" AND con(i - 1) = 0 AND i > 2 THEN
          FOR j = 2 TO ns
          con(j) = 0
          NEXT j
          con(i - 1) = 1
        ELSEIF tmp$ = "s" THEN
          con(i - 1) = 0
        END IF
        IF tmp$ = "s" THEN scanc
      LOOP UNTIL i = 2
END SUB '*****************************************************************
' This routine reads Keithly 619 electrometer channel 'select$' in
' current mode, returning measured current in 'amps'.
'*****************************************************************
SUB CurrMeas (select$, amps)
  SELECT CASE select$
    CASE "A"
      channel$ = k619A$              ' gpib address for channel A.
      valid = 1                      ' valid channel.
    CASE "B"
      channel$ = k619B$              ' gpib address for channel B.
      valid = 1                      ' valid channel.
    CASE ELSE
      PRINT "CurrMeas - Unknown current channel requested"
      valid = 0                      ' channel not valid.
  END SELECT
  IF valid = 1 THEN                              ' if channel valid...
    CALL send(channel$, "F1X", 0)                ' use channel 'channel$'.
    CALL receive(channel$, curr$, 20, 0)         ' receive data in curr$
    IF MID$(curr$, 2, 1) = "N" THEN
      curr$ = RIGHT$(curr$, LEN(curr$) - 5)  ' strip "<LF>NDCA" from data.
      curr$ = LEFT$(curr$, LEN(curr$) - 1)   ' strip <CR> from data.
      amps = VAL(curr$)                      ' convert string.
    ELSE
      PRINT "Electrometer has overflow current.  Control Break."
      ' Do something about restarting here ?
    END IF
  END IF
END SUB '*****************************************************************
' This routine sets current output on Keithly current source.
'*****************************************************************
SUB CurrOut (iout!)
  iout$ = STR$(iout!)                    ' convert 'iout' to string
  iout$ = RIGHT$(iout$, LEN(iout$) - 1)  ' strip leading space
  instruct$ = "I" + iout$ + "F1X"        ' imbed current value in command$
  CALL send(k224$, instruct$, 0)         ' send command$ to current source
END SUB
```

```
'***********************************************************************
' This routine downloads a data from the 4145 to a file on the computer.
'***********************************************************************
SUB download
  PRINT #1, "tmo 60"                          ' 60 second transfer time.
  size = 18000                                ' 15k character transfer.
  buffer$ = ""                                ' zero buffer.
  PRINT
  PRINT "Will be using HP4145B's PRINT command to output data."
  CALL send(hp4145$, "BC; PR;", 0)            ' clear hp4145 gpib buffer, print.

clin = CSRLIN
  ccol = POS(0)
  DO
    PRINT "Do you want to save this data? (Y/N)";
  DO
    ans$ = UCASE$(INKEY$)
  LOOP UNTIL ans$ <> ""
  SELECT CASE ans$
    CASE "Y"
      leave = 1                               ' allowed answer, can leave.
      PRINT
      INPUT "file name:"; name$               ' file name.
      OPEN "O", #3, name$                     ' open file for output.
      OPEN "O", #2, "dummy.dat"               ' open file for output.
      PRINT "Type in comment lines. Blank line terminates."
      DO
        LINE INPUT comment$
        PRINT #3, comment$
      LOOP UNTIL comment$ = ""
      PRINT "Downloading data..."
      CALL receive(hp4145$, buffer$, (size), 0)
      IF LEN(buffer$) > 0 THEN
        PRINT buffer$;
        PRINT #2, buffer$;                    ' save data.
        CLOSE #2                              ' close file.
        OPEN "I", #2, "dummy.dat"
        PRINT "Processing data before saving..."
        WHILE NOT EOF(2)
          buffer2$ = ""
          LINE INPUT #2, buffer$
          CALL filter(buffer$)
          PRINT #3, buffer$;
          PRINT buffer$;
        WEND
      END IF
      CLOSE #2
      CLOSE #3
    CASE "N"
      leave = 1                               ' allowed answer, can leave.
      PRINT "Downloading data..."
      CALL receive(hp4145$, buffer$, (size), 0)
      PRINT buffer$
    CASE ELSE
      leave = 0                               ' answer not allowed, redo.
      LOCATE clin, ccol
  END SELECT
```

```
   LOOP UNTIL leave <> 0                        ' loop until allowed choice.
   PRINT "Download finished.  Press any key to continue."
   DO
   LOOP UNTIL INKEY$ <> ""
   PRINT #1, "tmo 10"
END SUB '**********************************************************************
' This routine filters the output of the HP4145 converting unit
' abbreviations to exponential notation and correcting the format of
' negative numbers between 0 and -1.
'**********************************************************************
SUB filter (buffer$)
  buffer$ = buffer$ + " " + CHR$(13) + CHR$(10)
  i = 3
  length = LEN(buffer$)
  DO
    search$ = MID$(buffer$, i, 1)
    IF search$ = " " THEN
      unit$ = MID$(buffer$, i - 2, 3)
      start = i - 3
      SELECT CASE LEFT$(unit$, 2)
        CASE "mA"                           ' milli = 1/1000.
          new$ = "E-03"
        CASE "mV"
          new$ = "E-03"
        CASE "uA"
          new$ = "E-06"                     ' micro = 1/1000000.
        CASE "uV"
          new$ = "E-06"
        CASE "nA"
          new$ = "E-09"                     ' nano = 1/1000000000.
        CASE "nV"
          new$ = "E-09"
        CASE "pA"
          new$ = "E-12"                     ' pico = 1/1000000000000.
        CASE "pV"
          new$ = "E-12"
        CASE " -"
          new$ = " -0"
        CASE ELSE                           ' if V or A, strip it.
          IF MID$(unit$, 2, 1) = "V" OR MID$(unit$, 2, 1) = "A" THEN
            new$ = "    "
            start = i - 2
          ELSE
            new$ = unit$                    ' otherwise, no change.
          END IF
      END SELECT
                                            ' insert exp. not. into line.
      buffer2$ = LEFT$(buffer$, start) + new$
      buffer$ = buffer2$ + RIGHT$(buffer$, length - i)
      length = LEN(buffer$)
    END IF
    i = i + 1
  LOOP UNTIL i >= length             ' process entire input line.
END SUB

'**********************************************************************
```

```
' This routine consists of several general purpose communications sections
' for testing on the GPIB.
'*********************************************************************
SUB general
  esc$ = CHR$(27)
  DO
    CLS
    cline = CSRLIN
    ccol = POS(0)
    PRINT
    PRINT TAB(20); "GENERAL GPIB COMMUNICATIONS MENU - "
    PRINT
    PRINT TAB(25); "S - Send to device"          ' send string to device.
    PRINT TAB(25); "R - Receive from device"     ' receive string from device.

PRINT TAB(25); "P - Perform serial poll"     ' poll device status.
    PRINT TAB(25); "C - Issue controller command" ' message to controller.
    PRINT TAB(25); "A - Get controller status"   '
    PRINT TAB(25); "B - Issue bus commands"      ' send commands over bus.
    PRINT TAB(21); "<ESC> - Quit "               ' exit this routine.
    PRINT
    PRINT TAB(30); "selection:";

DO
      choice$ = UCASE$(INKEY$)                   ' get menu selection.
    LOOP UNTIL choice$ <> ""                     ' wait until key pressed.
    IF choice$ <> esc$ THEN                      ' process anything but <ESC>.
      SELECT CASE choice$
        CASE "S"                                 ' send.
          DO
            PRINT
            INPUT "enter device, string to send: ", dev$, sstr$
            IF dev$ <> "" THEN
              CALL send(dev$, sstr$, 0)
              PRINT
            END IF
          LOOP UNTIL dev$ = ""
        CASE "R"                                 ' receive.
          DO
            PRINT
            INPUT "enter device to receive from, # bytes: ", dev$, bytes%
            IF dev$ <> "" THEN
              CALL receive(dev$, rstr$, bytes%, 0)
              PRINT "bytes received ="; STR$(bytes%)
              PRINT "string received:"; rstr$
              PRINT
            END IF
          LOOP UNTIL dev$ = ""
        CASE "P"                                 ' poll device.
          DO
            PRINT
            INPUT "device address to poll:", dev$
            IF dev$ <> "" THEN
              dummy% = spoll%(dev$, 0)
              PRINT "poll byte for device " + dev$ + " = " + STR$(dummy%)
              PRINT
            END IF
          LOOP UNTIL dev$ = ""
        CASE "C"                                 ' send controller command.
```

```
            DO
              PRINT
              INPUT "message to send to GPIB controller: ", sstr$
              PRINT #1, sstr$
              CALL checkerror("direct", "controller")
            LOOP UNTIL sstr$ = ""
          CASE "A"
            PRINT
            CALL status(stat%, stat$)
            PRINT "status byte =", stat%
            PRINT "status string:" + stat$
            DO
            LOOP UNTIL INKEY$ <> ""
          CASE "B"                                    ' send bus command.
            DO
              PRINT
              INPUT "CMD mnemonics to send over GPIB: ", arg$
              IF arg$ <> "" THEN
                CALL gpib(arg$, 0)
              END IF
            LOOP UNTIL arg$ = ""
          CASE ELSE                                   ' not a menu selection.
            LOCATE cline, ccol
        END SELECT
     END IF    ' choice$
  LOOP UNTIL choice$ = esc$                           ' repeat until <ESC> selected.

END SUB

'*********************************************************************
' This routine loads a file stored on the HP4145 disk into HP4145 memory
' for execution, downloading, or analysis.
'*********************************************************************
SUB get4145
  clin = CSRLIN
  ccol = POS(0)
  DO
    valid = 1
    PRINT
    PRINT "Get program/data on HP4145."
    PRINT "Getting P(rogram), D(ata/program), or (Auto) S(equence File)?";
    DO
      choice$ = UCASE$(INKEY$)
    LOOP UNTIL choice$ <> ""
    SELECT CASE choice$
      CASE "P"                                        ' program file.
        func$ = "P "
      CASE "D"
        func$ = "D "                                  ' data file.
      CASE "S"
        func$ = "S "                                  ' automatic sequence file.
      CASE ELSE
        valid = 0
        LOCATE clin, ccol
    END SELECT
    IF valid = 1 THEN
      PRINT "Enter filename (6 char): nnnnnn :"       ' HP4145 file name.
      INPUT name$
      arg$ = UCASE$("BC; GT '" + func$ + name$ + "';")  ' assemble command.
      CALL send(hp4145$, arg$, 0)                     ' send command to 4145.
```

```
      PRINT "Retrieving file on HP4145."
    END IF
  LOOP UNTIL valid = 1
  CALL pause(2)
END SUB '***********************************************************************
' This routine accepts a string of gpib mnemonics which it converts and
' assembles into a character string before transmitting with a CMD
' instruction. If 'pr' argument is non-zero, the routine prints the message
' sent over the bus.
'***********************************************************************
SUB gpib (arg$, PR)                        ' arg$ is gpib mnemonics
'
  DIM in$(0 TO 128)

' table of gpib mnemonics
  in$(0)  = ""
  in$(1)  = "GTL"            ' Go To Local.
  in$(2)  = ""
  in$(3)  = ""
  in$(4)  = "SDC"            ' Selected Device Clear.
  in$(5)  = "PPC"            ' Parallel Poll Configure.
  in$(6)  = ""
  in$(7)  = ""
  in$(8)  = "GET"            ' Group Execute Trigger.
  in$(9)  = "TCT"            ' Take Control.
  in$(10) = ""
  in$(11) = ""
  in$(12) = ""
  in$(13) = ""
  in$(14) = ""
  in$(15) = ""
  in$(17) = "LLO"            ' Local Lockout.
  in$(18) = ""
  in$(19) = ""
  in$(20) = "DCL"            ' Device Clear.
  in$(21) = "PPU"            ' Parallel Poll Unconfigure.
  in$(22) = ""
  in$(23) = ""
  in$(24) = "SPE"            ' Serial Poll Enable.
  in$(25) = "SPD"            ' Serial Poll Disable.
  in$(26) = ""
  in$(27) = ""
  in$(28) = ""
  in$(29) = ""
  in$(30) = ""
  in$(31) = ""
  in$(32) = "MLA0"           ' Listen Addresses.
  in$(33) = "MLA1"
  in$(34) = "MLA2"
  in$(35) = "MLA3"
  in$(36) = "MLA4"
  in$(37) = "MLA5"
  in$(38) = "MLA6"
  in$(39) = "MLA7"
  in$(40) = "MLA8"
  in$(41) = "MLA9"
  in$(42) = "MLA10"
```

```
in$(43) = "MLA11"
in$(44) = "MLA12"
in$(45) = "MLA13"
in$(46) = "MLA14"
in$(47) = "MLA15"
in$(48) = "MLA16"
in$(49) = "MLA17"
in$(50) = "MLA18"
in$(51) = "MLA19"
in$(52) = "MLA20"
in$(53) = "MLA21"
in$(54) = "MLA22"
in$(55) = "MLA23"
in$(56) = "MLA24"
in$(57) = "MLA25"
in$(58) = "MLA26"
in$(59) = "MLA27"
in$(60) = "MLA28"
in$(61) = "MLA29"
in$(62) = "MLA30"
in$(63) = "UNL"          ' Unlisten.
in$(64) = "MTA0"         ' Talk Addresses.
in$(65) = "MTA1"
in$(66) = "MTA2"
in$(67) = "MTA3"
in$(68) = "MTA4"
in$(69) = "MTA5"
in$(70) = "MTA6"
in$(71) = "MTA7"
in$(72) = "MTA8"
in$(73) = "MTA9"
in$(74) = "MTA10"
in$(75) = "MTA11"
in$(76) = "MTA12"
in$(77) = "MTA13"
in$(78) = "MTA14"
in$(79) = "MTA15"
in$(80) = "MTA16"
in$(81) = "MTA17"
in$(82) = "MTA18"
in$(83) = "MTA19"
in$(84) = "MTA20"
in$(85) = "MTA21"
in$(86) = "MTA22"
in$(87) = "MTA23"
in$(88) = "MTA24"
in$(89) = "MTA25"
in$(90) = "MTA26"
in$(91) = "MTA27"
in$(92) = "MTA28"
in$(93) = "MTA29"
in$(94) = "MTA30"
in$(95) = "UNT"          ' Untalk.
in$(96) = "MSA0"         ' Secondary Addresses.
in$(97) = "MSA1"
in$(98) = "MSA2"
in$(99) = "MSA3"
in$(100) = "MSA4"
in$(101) = "MSA5"
```

```
in$(102) = "MSA6"
in$(103) = "MSA7"
in$(104) = "MSA8"
in$(105) = "MSA9"
in$(106) = "MSA10"
in$(107) = "MSA11"
in$(108) = "MSA12"
in$(109) = "MSA13"
in$(110) = "MSA14"
in$(111) = "MSA15"
in$(112) = "MSA16"
in$(113) = "MSA17"
in$(114) = "MSA18"
in$(115) = "MSA19"
in$(116) = "MSA20"
in$(117) = "MSA21"
in$(118) = "MSA22"
in$(119) = "MSA23"
in$(120) = "MSA24"
in$(121) = "MSA25"
in$(122) = "MSA26"
in$(123) = "MSA27"
in$(124) = "MSA28"
in$(125) = "MSA29"
in$(126) = "MSA30"
in$(127) = ""
in$(128) = ""

' main routine
true = 1                                           ' boolean constants.
false = 0
out$ = ""                                          ' initialize output string.
head% = 1                                          ' initialize position counters.
tail% = 1
erflg = false                                      ' initialize error flag.
DO                                                 ' scan thru arg$.
   tail% = INSTR(head%, arg$, " ")                 ' look for spaces between mnem's.
   IF tail% = 0 THEN tail% = LEN(arg$) + 1         ' no space before end of arg$.

mne$ = UCASE$(MID$(arg$, head%, tail% - head%))  ' mnem between counters.

i% = 0                                          ' start at beginning of table.
   DO                                              ' loop thru table.
      i% = i% + 1
   LOOP UNTIL ((mne$ = in$(i%)) OR (i% > 127))     ' find mnem or end of table.

IF i% < 128 THEN                                ' if mnem found.
      out$ = out$ + CHR$(i%)                       ' add char to out$.
   ELSEIF (i% = 128) AND (mne$ = "DATA") THEN      ' if last word is DATA.
      ' do nothing                                 ' add nothing to out$.
   ELSE                                            ' mnem not in table.
      PRINT "GPIB - error - unknown mnemonic, " + mne$ + "."
      erflg = true                                 ' error is flagged.
   END IF
   head% = tail% + 1                               ' move head to next mnem.
```

```
      LOOP UNTIL (tail% > LEN(arg$)) OR (erflg = true)  ' until finished with arg$
                                                        ' or unknown mnem.
      IF erflg = false THEN                             ' if no errors.
        PRINT #1, "cmd" + CHR$(13) + out$               ' send CMD string.
        IF PR <> 0 THEN PRINT "cmd" + CHR$(13) + out$   ' for debugging only.
   '    CALL checkerror("gpib", "interface")
        IF mne$ = "DATA" THEN                           ' last argument, for independent transfers.

PRINT #1, "gts 0"                             ' controller to standby, take synchronous
                                                        ' control after transfer.
          IF PR <> 0 THEN PRINT "gts 0"                 ' for debugging only.
   '      CALL checkerror("gpib", "interface")          ' check for errors.
        END IF
      END IF
END SUB '**********************************************************************
' This routine tells the GPIB-232CT controller to wait for it status word
' to have the bits in 'mask' set before continuing.  If the 'pr' argument
' is non-zero, the routine will print the message it sent to the controller.
' The routine reads the status of the controller but does nothing with
' that information.
'**********************************************************************
SUB gpwait (mask, PR)
  PRINT #1, "WAIT" + STR$(mask)
  IF PR <> 0 THEN PRINT "WAIT" + STR$(mask)
  INPUT #1, stat$
  INPUT #1, gp$
  INPUT #1, sp$
  INPUT #1, cnt$
END SUB '**********************************************************************
' This routine initializes the gpib controller and some of the devices on
' the bus.  It clears most devices, but leaves settings on the HP4145 alone.
'**********************************************************************
SUB initgpib
  PRINT #1, "onl 1"                                     ' put controller on line.
  PRINT #1, "clr ", fg5010$, ps5010$, k224$, k619A$, k619B$' clear all devices.

poll% = spoll%(hp4145$, 0)                            ' poll parameter analyzer.
  poll% = spoll%(fg5010$, 0)                            ' poll function generator.
  poll% = spoll%(ps5010$, 0)                            ' poll power supply.
  poll% = spoll%(k224$, 0)                              ' poll current source.
  poll% = spoll%(k619A$, 0)                             ' poll electrometer A.
  poll% = spoll%(k619B$, 0)                             ' poll electrometer B.
  poll% = spoll%(si5010$, 0)                            ' poll scanner.
  CALL send(fg5010$, "init;", 0)                        ' initialize function generator.
  CALL send(ps5010$, "init;", 0)                        ' initialize power supply.
  CALL send(k224$, "M5V50X", 0)                         ' initialize current source.
  CALL send(k619A$, "F1R1XC1XZ1X", 0)                   ' initialize electrometer channel A.

CALL send(k619A$, "F0R1XC1XZ1X", 0)                   ' initialize electrometer channel A.
  CALL send(k619A$, "R0C0XT4X", 0)
  CALL send(k619B$, "F1R1XC1XZ1X", 0)                   ' initialize electrometer channel B.

CALL send(k619B$, "F0R1XC1XZ1X", 0)                   ' initialize electrometer channel B.
```

```
   CALL send(k619B$, "R0C0XT4X", 0)
   CALL send(si5010$, "init;", 0)              ' initialize scanner.
END SUB SUB meamm
        CALL PlotAxes
        CALL capres
END SUB '*******************************************************************
' This routine sets up the HP4145A measure drain IV characteristics for
' MOSFET enhancement mode devices.  Drain voltage from -2.5 to 2.5 V, gate
' voltage 0 to 4 V.  The data is displayed on the 4145 screen.  You need
' to send the 'BC MD ME1;' command string to start data collection.
'*******************************************************************
SUB measA
   string1$ = "DE CH1,'VS','IS',3,3;CH2,'VDS','ID',1,1;"
   string2$ = "CH3,'VG','IG',1,2,;CH4;VS1;VS2;VM1;VM2;"
   string3$ = "SS VR1,-2.5,2.5,0.05,0.020;VP 0.0,1.0,5,1E-3;"
   string4$ = "SM DM1 XN 'VDS',1,-2.5,2.5;YA 'ID',1,-10E-3,10E-3;"
   PRINT #1, "clr "; hp4145$
   CALL send(hp4145$, "BC DR1", 0)
   CALL send(hp4145$, string1$, 0)
   CALL send(hp4145$, string2$, 0)
   CALL send(hp4145$, string3$, 0)
   CALL send(hp4145$, string4$, 0)
END SUB '*******************************************************************
' This routine sets up the HP4145 to measure drain IV curves on MOSFET
' depletion mode devices.  Drain voltage from -2.5 to 2.5 V, gate voltage
' from 0 to -4 V.  You have to send the 'BC MD ME1;' command to start data
' collection.  Data is displayed on the 4145 screen.
'*******************************************************************
SUB measB
   string1$ = "DE CH1,'VS','IS',3,3;CH2,'VDS','ID',1,1;"
   string2$ = "CH3,'VG','IG',1,2;CH4;VS1;VS2;VM1;VM2;"
   string3$ = "SS VR1,-2.5,2.5,0.05,0.020;VP 0.0,-1.0,5,1E-3;"
   string4$ = "SM DM1 XN 'VDS',1,-2.5,2.5;YA 'ID',1,-10E-3,10E-3;"
   PRINT #1, "clr "; hp4145$
   CALL send(hp4145$, "BC DR1", 0)
   CALL send(hp4145$, string1$, 0)
   CALL send(hp4145$, string2$, 0)
   CALL send(hp4145$, string3$, 0)
   CALL send(hp4145$, string4$, 0)
'*******************************************************************
' This routine sets up the HP4145 to measure collector IV curves for bipolar
' NPN transistors.  Collector voltages from 0 to 1 V, base current from
' 10 uA to 50 uA.  You have to send the 'BC MD ME1;' command to start
' data collection.  Data is displayed on the 4145 screen.
'*******************************************************************
SUB measC
   string1$ = "DE CH1,'VE','IE',3,3;CH2,'VCE','IC',1,1;"
   string2$ = "CH3,'VB','IB',2,2;CH4;VS1;VS2;VM1;VM2;"
   string3$ = "SS VR1,0.0,1.0,0.01,0.1;IP 10E-6,10E-6,5,2.0;"
   string4$ = "SM DM1 XN 'VCE',1,0,1;YA 'IC',1,0,10E-3;"
   PRINT #1, "clr "; hp4145$
   CALL send(hp4145$, "BC DR1", 0)
   CALL send(hp4145$, string1$, 0)
```

```
    CALL send(hp4145$, string2$, 0)
    CALL send(hp4145$, string3$, 0)
    CALL send(hp4145$, string4$, 0)
END SUB '*********************************************************************
' This routine sets up the HP4145 to measure collector IV curves for
' bipolar PNP transistors.  Collector voltages from 0 to -1 V, base currents
' from -10 uA to -50 uA.  You have to send the 'BC MD ME1;' command to
' start data collection.  Data is displayed on the 4145 screen.
'*********************************************************************
SUB measD
    string1$ = "DE CH1,'VE','IE',3,3;CH2,'VCE','IC',1,1;"
    string2$ = "CH3,'VB','IB',2,2;CH4;VS1;VS2;VM1;VM2;"
    string3$ = "SS VR1,0.0,-1.0,-0.01,-0.1;IP -10E-6,-10E-6,5,-2.0"
    string4$ = "SM DM1 XN 'VCE',1,0,-1;YA 'IC',1,0,-10E-3;"
    PRINT #1, "clr "; hp4145$
    CALL send(hp4145$, "BC DR1", 0)
    CALL send(hp4145$, string1$, 0)
    CALL send(hp4145$, string2$, 0)
    CALL send(hp4145$, string3$, 0)
    CALL send(hp4145$, string4$, 0)
END SUB '*********************************************************************
' This routine sets up the HP4145 to measure log(I)-V curves for devices.
' You have to send the 'BC MD ME1;' command to start data collection.  Data
' is displayed on the 4145 screen.
'*********************************************************************
SUB measE
    string1$ = "DE CH1,'V1','I1',3,3;CH2;CH3,'V3','I3',1,1;"
    string2$ = "CH4,'V4','I4',1,3;VS1;VS2;VM1;VM2;"
    string3$ = "SS VR1,-5.0,5.0,.1,.1;VC4,-5.0,.1;"
    string4$ = "SM DM1 XN 'V3',1,-5,5;YA 'I4',2,-0.01E-12,-10E-3;"
    PRINT #1, "clr "; hp4145$
    CALL send(hp4145$, "BC DR1", 0)
    CALL send(hp4145$, string1$, 0)
    CALL send(hp4145$, string2$, 0)
    CALL send(hp4145$, string3$, 0)
    CALL send(hp4145$, string4$, 0)
END SUB '*********************************************************************
' This routine controls the measurements function on the HP4145
' parameter analyzer.
'*********************************************************************
SUB measurements
    esc$ = CHR$(27)
    PRINT #1, "tmo 60"              ' lengthen timeout to 60 seconds.
    size = 15000                    ' max number of characters to transfer.

'The following lines are a template for the menu selections below.
'    string1$ = "DE CH1,'','',,;CH2,'','',,;CH3,'','',,;CH4,'','',,;"
'    string2$ = "VS1;VS2;VM1;VM2;"
'    string3$ = "SS VR,,,,;"
'    string4$ = "SM DM2 LI '';"
```

```
' MENU HERE.
CLS
PRINT
PRINT TAB(5); "HP4145B Parameter Analyzer Measure and Download"
PRINT
PRINT TAB(10); "A - MOSFET enhancement mode"
PRINT TAB(10); "B - MOSFET depletion mode"
PRINT TAB(10); "C - Bipolar NPN "
PRINT TAB(10); "D - Bipolar PNP "
PRINT TAB(10); "E - Log (I) vs V "
PRINT TAB(10); "Y - Use present settings on HP4145"
PRINT TAB(10); "Z - Load and run program file on HP4145"
PRINT TAB(6); "<ESC> - Leave this menu "
PRINT
PRINT TAB(10); "Selection: ";
clin = CSRLIN
ccol = POS(0)
DO
  DO
    choice$ = UCASE$(INKEY$)
  LOOP UNTIL choice$ <> ""
  leave = 1
  measure = 1
  SELECT CASE choice$
    CASE "A"                              ' MOSFET enhancement.
      CALL measA
    CASE "B"                              ' MOSFET depletion.
      CALL measB
    CASE "C"                              ' Bipolar NPN.
      CALL measC
    CASE "D"                              ' Bipolar PNP.
      CALL measD
    CASE "E"                              ' Resistance.
      CALL measE
    CASE "Y"                              ' Log(I) vs V
      CALL measY
    CASE "Z"
      CALL measZ
    CASE esc$                             ' allows exit from menu.
      measure = 0                         ' take no measurements.
    CASE ELSE
      LOCATE clin, ccol
      leave = 0
  END SELECT
LOOP UNTIL leave = 1

IF measure = 1 THEN
  PRINT
  PRINT "HP4145 parameters may be changed manually at this time."
  PRINT
  PRINT "File name for data output (path + 8 chars, no extension):";
  INPUT root$                                  ' file name.

INPUT "Number of die to measure:", dies
  PRINT
```

```
PRINT "Do you want any plots as the data is collected? (Y/N)";
DO
   plot$ = UCASE$(INKEY$)
LOOP UNTIL plot$ <> ""

FOR i2 = 1 TO dies name$ = root$ + "." + LTRIM$(STR$(i2))
   OPEN name$ FOR OUTPUT AS #3                   ' output file.
   PRINT #3, "Data for die #" + LTRIM$(STR$(i2))
   PRINT #3, ""
   CALL send(hp4145$, "BC MD ME1;", 0)           ' clear buffer and measure.
   PRINT "Waiting for measurement to complete...";
   CALL gpwait(4096, 0)                          ' wait for data ready SRQ.
     poll = spoll%(hp4145$, 0)                   ' clear SRQ.
     PRINT
     CALL send(hp4145$, "PR", 0)                 ' tell 4145 to output.
     OPEN "dummy.dat" FOR OUTPUT AS #2           ' temporary storage.
     PRINT "Downloading data...";
     CALL receive(hp4145$, buffer$, (size), 0)   ' receive data.
     PRINT
     IF LEN(buffer$) > 0 THEN
        PRINT buffer$;
        PRINT #2, buffer$;                       ' save data.
        CLOSE #2                                 ' close file.
        OPEN "dummy.dat" FOR INPUT AS #2         ' re-open for processing.
        WHILE NOT EOF(2)                         ' this loop converts units
           buffer2$ = ""                         '  abbrev to exponential not.
           LINE INPUT #2, buffer$                ' read line from file.
           CALL filter(buffer$)                  ' convert units to exp. notation.
           PRINT #3, buffer$;                    ' output new line to data file.
           PRINT buffer$;                        ' print on screen.
        WEND                                     ' continue thru temporary file.
     END IF
     CLOSE #2                                    ' close temporary file.
     CLOSE #3                                    ' close data file.
     IF plot$ = "Y" THEN
        PRINT "You can plot this now - 'Y' plots, any other ";
        PRINT "key continues to next die."
        DO
           choice$ = UCASE$(INKEY$)
        LOOP UNTIL choice$ <> ""
        IF choice$ = "Y" THEN plot4145
     END IF
  NEXT i2                                        ' repeat for each die.
END IF     ' measure.

CALL send(hp4145$, "DR0", 0)                    ' turn off data ready SRQ.
PRINT #1, "tmo 10"                              ' return timeout period to 10 seconds.

END SUB

'*********************************************************************
' This routine sets up the HP4145 to measure using the present settings on
' the instrument.
'*********************************************************************
```

```
SUB measY
  CALL send(hp4145$, "BC DR1", 0)
END SUB

'**********************************************************************
' This routine loads a program file on the HP4145 to set up for a
' measurement.  You need to send the 'BC MD ME1;' command to start data
' collection.  The format of the data display on the 4145 screen is
' controlled by the loaded program.
'**********************************************************************
SUB measZ
  PRINT
  PRINT
  INPUT "What is the name of .PRO file on HP4145", name$
  name$ = UCASE$(name$)
  PRINT #1, "clr "; hp4145$
  CALL send(hp4145$, "BC DR1", 0)
  arg$ = "GT 'P " + name$ + "';"
  CALL send(hp4145$, arg$, 0)
END SUB '**********************************************************************
' This routine displays the main menu for STATION1.BAS and allows
' choices to be made from the menu.  This is where new functions could
' be added to the program for driving different types of measurements.
'**********************************************************************
SUB menu
  capint                               'Constants for capres are set
  esc$ = CHR$(27)
  DO
    CLS
    COLOR 7, 0
    cline = CSRLIN
    ccol = POS(0)
    PRINT TAB(20); "STATION1 MAIN MENU SELECTIONS:"
    PRINT
    PRINT TAB(25); "P - Run parameter analyzer (menu)"
    PRINT
    PRINT TAB(25); "C - Capacitor Main Menu"
    PRINT
    PRINT TAB(25); "G - General GPIB communications routines (menu)"
    PRINT
    PRINT TAB(21); "<ESC> - Quit program"
    PRINT
    PRINT TAB(30); "selection: ";
    DO
      a$ = UCASE$(INKEY$)
    LOOP UNTIL a$ <> ""
    PRINT
    PRINT
    IF a$ <> esc$ THEN
      SELECT CASE a$
        CASE "C"
          Capmm
        CASE "G"
          general
        CASE "P"
```

```
            ParamAn
          CASE ELSE
             LOCATE cline, ccol
        END SELECT
      END IF
  LOOP UNTIL a$ = esc$
END SUB '*********************************************************************
' This is the main menu for the CapRes procedure which performs
' capacitance and resistance measurements on devices.
'*********************************************************************
SUB menu0 (a$)
  DO
    SCREEN 0
    COLOR 7, 0
    CLS
    PRINT TAB(5); "CAPACITANCE-RESISTANCE STATUS SCREEN"
    LOCATE 4, 7
    PRINT "This is what I have:"
    CALL menu1
    CALL menu2
    CALL menu3
    CALL menu4
    CALL menu5
    CALL menu6
    CALL menu7
    CALL menu8
    CALL menu9
    CALL menu10
    CALL menu11
    CALL menu12
    CALL menu14
    CALL menu13(a$)
    SELECT CASE a$
      CASE "C"
         CALL ChParams                    ' change parameters
      CASE ELSE
         ' choice not C, restart menu
    END SELECT
  LOOP UNTIL (a$ = "R")      ' R leaves menu.
END SUB '*********************************************************************
' This is a submenu for menu0. It is used by the CapRes procedure.
'*********************************************************************
SUB menu1
  LOCATE 6, 7
  PRINT "1) Output data file:";
  LOCATE 6, 50
  PRINT ">>";
  LOCATE 6, 53
  PRINT f$;
END SUB
```

```
'***********************************************************************
' This is a submenu for menu0. It is used by the CapRes procedure.
'***********************************************************************
SUB menu10
  LOCATE 15, 7
  PRINT "R) Upper limit fir plotting R (Meg-ohms):";
  LOCATE 15, 53
  PRINT USING "####"; rmax;
END SUB '***********************************************************************
' This is a submenu for menu0. It is used by the CapRes procedure.
'***********************************************************************
SUB menu11
  LOCATE 16, 7
  PRINT "C) Upper limit for plotting C (pf):";
  LOCATE 16, 53
  PRINT USING "####"; cmax;
END SUB SUB menu12
  LOCATE 17, 7
  PRINT "L) Turn light on to equilibrate (yes or no):";
  LOCATE 17, 53
  l$ = SPACE$(4)
  RSET l$ = light$
  PRINT l$;
END SUB '***********************************************************************
' This is a submenu for menu0. It is used by the CapRes procedure.
'***********************************************************************
SUB menu13 (answer$)
  LOCATE 19, 7
  COLOR 7, 1
  PRINT "C";
  COLOR 7, 0
  PRINT ")hange parameter";
  LOCATE 19, 54
  COLOR 7, 1
  PRINT "R";
  COLOR 7, 0
  PRINT "-back to main menu";
  DO
    answer$ = UCASE$(INKEY$)
  LOOP UNTIL answer$ = "P" OR answer$ = "C" OR answer$ = "R"
END SUB SUB menu14
  LOCATE 18, 7
  PRINT "M) Full Scale on Boonton Cap. Meter:";
  LOCATE 18, 53
  PRINT USING "####"; bscale;
END SUB '***********************************************************************
' This is a submenu for menu0. It is used by the CapRes procedure.
'***********************************************************************
```

```
SUB menu2
  LOCATE 7, 7
  PRINT "2) Initial gate voltage (volts):";
  LOCATE 7, 53
  PRINT USING "####.##"; vgmin;
END SUB '*********************************************************************
' This is a submenu for menu0. It is used by the CapRes procedure.
'*********************************************************************
SUB menu3
  LOCATE 8, 7
  PRINT "3) Final gate voltage (volts):";
  LOCATE 8, 53
  PRINT USING "####.##"; vgmax;
END SUB '*********************************************************************
' This is a submenu for menu0. It is used by the CapRes procedure.
'*********************************************************************
SUB menu4
  LOCATE 9, 7
  PRINT "4) Voltage increment (volts):";
  LOCATE 9, 53
  PRINT USING "####.##"; dvg;
END SUB '*********************************************************************
' This is a submenu for menu0. It is used by the CapRes procedure.
'*********************************************************************
SUB menu5
  LOCATE 10, 7
  PRINT "5) Full scale sensitivity of lock-in (mv):";
  LOCATE 10, 53
  PRINT USING "####.####"; sens * 1000;
END SUB
'*********************************************************************
' This is a submenu for menu0. It is used by the CapRes procedure.
'*********************************************************************
SUB menu6
  LOCATE 11, 7
  PRINT "6) Time delay between measurements (seconds):";
  LOCATE 11, 53
  PRINT USING "####"; delay;
END SUB '*********************************************************************
' This is a submenu for menu0. It is used by the CapRes procedure.
'*********************************************************************
SUB menu7
  LOCATE 12, 7
  PRINT "7) Frequency (KHz):";
  LOCATE 12, 53
  PRINT USING "####.###"; freq / 1000;
END SUB '*********************************************************************
' This is a submenu for menu0. It is used by the CapRes procedure.
'*********************************************************************
```

```
SUB menu8
  LOCATE 13, 7
  PRINT "8) Ro (K-ohms):";
  LOCATE 13, 53
  PRINT USING "####.###"; r0 / 1000;
END SUB '*********************************************************************
' This is a submenu for menu0. It is used by the CapRes procedure.
'*********************************************************************
SUB menu9
  LOCATE 14, 7
  PRINT "9) Vo (mv):";
  LOCATE 14, 53
  PRINT USING "####.###"; v0 * 1000;
END SUB SUB opemm
'*****************************************************************
'This subroutine prints out the menu for operation selection menu
'*****************************************************************
DIM a$(20)
CLS
ns = 6
a$(1) = "Capacitor Main Menu"
a$(2) = "Low-Frequency C-V Measurement"
a$(3) = "High-Frequency C-V Measurement"
a$(4) = "Calculate Doping & States From H/L C-V"
a$(5) = "Calcualte Doping & States From H C-V"
a$(6) = "Conduct Stress Bias"
LOCATE 1, 30
COLOR 7, 1
PRINT "Operation Selection"
COLOR 7, 0
FOR i = 1 TO ns
LOCATE (2 + i * 2), 20
PRINT a$(i)
NEXT i
DO
i = 1
        FOR j = 2 TO ns
        LOCATE (2 + j * 2), 18
        COLOR 7, 5
        IF ope(j) = 1 THEN
        PRINT "X"
        ELSE
        COLOR 7, 0
        PRINT " "
        END IF
        NEXT j DO
        LOCATE (2 + i * 2), 14
        COLOR 7, 4
        PRINT "O"
                DO
                tmp$ = INKEY$
                LOOP UNTIL tmp$ <> ""
```

```
        LOCATE (2 + i * 2), 14
        COLOR 7, 0
        PRINT " "
        i = i + 1
        LOOP UNTIL tmp$ = "s" OR i = ns + 1
        IF tmp$ = "s" AND ope(i - 1) = 0 THEN
        ope(i - 1) = 1
        ELSEIF tmp$ = "s" THEN
        ope(i - 1) = 0
        END IF
        LOOP UNTIL i = 2

END SUB

'*********************************************************************
' This routine runs several different functions on the HP4145
' parameter analyzer.  Selections are available from a menu for file
' operations, plotting and measurements.
'*********************************************************************
SUB ParamAn
    esc$ = CHR$(27)
    DO
        CLS
        PRINT
        PRINT TAB(20); " HP4145 PARAMETER ANALYZER MENU"
        PRINT
        PRINT TAB(25); "G - Get program or data file on HP4145"
        PRINT
        PRINT TAB(25); "S - Save program or data file on HP4145"
        PRINT
        PRINT TAB(25); "D - Download data in analyzer buffer to computer"
        PRINT
        PRINT TAB(25); "P - Plot data in analyzer buffer"
        PRINT
        PRINT TAB(25); "Q -   DG plotting from analyzer"
        PRINT
        PRINT TAB(25); "M - Measure and download data to computer"
        PRINT
        PRINT TAB(21); "<ESC> - Leave this menu"
        PRINT
        PRINT TAB(30); "selection:";
        DO
            choice$ = UCASE$(INKEY$)
        LOOP UNTIL choice$ <> ""
        IF choice$ <> esc$ THEN
            SELECT CASE choice$
                CASE "G"                            ' get setup or data file.
                    PRINT "get analyzer file"
                    get4145
                CASE "S"                            ' save setup or data file.
                    PRINT "save analyzer file"
                    save4145
                CASE "D"                            ' Download data from analyzer.
                    PRINT "download data from analyzer to computer"
                    download
                CASE "P"                            ' plot data from analyzer.
                    PRINT "plot data from analyzer on plotter"
                    plot4145
                CASE "Q"
                    qplot4145
```

```
              CASE "M"                        ' measure and download data.
                CALL measurements
              CASE ELSE
                LOCATE 1, 1
            END SELECT
          END IF
      LOOP UNTIL choice$ = esc$
    END SUB
'******************************************************************
' This routine causes program execution to wait for 'seconds%' seconds.
'******************************************************************
SUB pause (seconds%)
  tstart = TIMER
  DO
  LOOP UNTIL (TIMER - tstart) >= seconds%
END SUB '******************************************************************
' This routine plots data directly from the HP4145 to the HP plotter.
'******************************************************************
SUB plot4145
  PRINT
  PRINT "Plotting HP4145 data on plotter."
  arg$ = "BC; PL 100,100,10000,8000;"
  CALL send(hp4145$, arg$, 0)              ' tell 4145 to plot.
  arg$ = "UNT UNL MTA" + hp4145$ + " MLA" + plot$ + " DATA"
                  ' 4145 talking, plotter listening, controller out.
  CALL gpib(arg$, 0)
  PRINT "Data should be plotting now...press <ESC> when finished."

' This might replace the SRQ section below if using GTS 1 controller mode.
'    i5 = 1
'    DO
'      CALL status(stat%, stat$)
'      LOCATE 24, 10
'      PRINT i5; stat%;
'      i5 = i5 + 1
'    LOOP UNTIL (stat% AND 8192) <> 0

' hp4145 has bug in generation of SRQ on PLOT command, so this is not
' reliable.
'   CALL gpwait(4096, 0)                   ' controller waiting for SRQ.
'   hppoll = spoll%(hp4145$, 0)
'
  DO
  LOOP UNTIL INKEY$ = CHR$(27)
  CALL checkerror("PLOT4145", "controller")  ' read status after SRQ.
  CALL send(hp4145$, "PF;", 0)
  CALL gpib("UNL UNT", 0)
  PRINT "Data should have plotted out."
  CALL pause(2)
END SUB '******************************************************************
' This routine plots the axes on the screen for the CapRes subprogram.
' Capacitance and resistance values are plotted as a function of gate
' voltage.
'******************************************************************
```

```
SUB PlotAxes
  top = 20
  bottom = 300
  yint = (bottom - top) / 10
  CLS
  SCREEN 9, 1
  COLOR 3
  vmax = vgmax
  vmin = vgmin
  IF vmax < vmin THEN SWAP vmax, vmin
  FOR i = 0 TO 10
    LOCATE 23, 9 + 6 * i
    PRINT USING "##.##"; vmin + i * (vmax - vmin) / 10
  NEXT i
  LINE (84, top)-(564, top)              ' these 4 lines border plot area.
  LINE -(564, bottom)
  LINE -(84, bottom)
  LINE -(84, top)
  FOR i = 0 TO 9                         ' draw x ticks.
    LINE (84 + 48 * i, top)-(84 + 48 * i, yint)
    LINE (84 + 48 * i, bottom - 5)-(84 + 48 * i, bottom)
  NEXT i
  FOR i = 0 TO 10
    COLOR 3
    LINE (84, yint * i + top)-(94, yint * i + top)       ' draw y ticks.
    LINE (554, yint * i + top)-(564, yint * i + top)
    h = rmax - i * rmax / 10             ' resistance scale.
    j = cmax - i * cmax / 10             ' capacitance scale.
    COLOR 6
    LOCATE 4 + 2 * (i - 1), 3
    PRINT USING "####.##"; h             ' resistance values.
    COLOR 7
    LOCATE 4 + 2 * (i - 1), 73
    PRINT USING "####.##"; j             ' capacitance values.
  NEXT i
  COLOR 6
  LOCATE 1, 1
  PRINT "R(Meg-ohms)";                   ' label left axis.
'  CIRCLE (100, 3), 2
  CIRCLE (100, 3), 1
  COLOR 15
  LOCATE 1, 72
  PRINT "C(pf)";                         ' label right axis.
'  CIRCLE (620, 3), 2
  CIRCLE (620, 3), 1
  COLOR 3
  LOCATE 24, 34
  PRINT "Voffset (volts)";               ' label horizontal axis.
  IF NOT pass THEN
    pass = 1
    GET (98, 1)-(102, 5), r2#
    GET (618, 1)-(622, 5), c2#
  END IF
  COLOR 5
  LOCATE 24, 61
  PRINT USING "f =###.### KHz"; freq / 1000;    ' announce measuring freq.

END SUB
```

```
'*********************************************************************
' This routine plots data points on the screen using the axes drawn
' by PlotAxes.  This routine is used by the CapRes procedure.
'*********************************************************************
SUB PlotPt (voffset, r, c)
  vmin = vgmin
  vmax = vgmax
  IF vmax < vmin THEN SWAP vmin, vmax
  px = 480 * (voffset - vmin) / (vmax - vmin) + 84
  IF px >= 84 AND px <= 564 THEN
    pyr = 300 - 280 * r / rmax
    IF pyr >= 20 AND pyr <= 300 THEN PUT (px - 2, pyr - 2), r2#, OR
    pyc = 300 - 280 * c / cmax
    IF pyc >= 20 AND pyc <= 300 THEN PUT (px - 2, pyc - 2), c2#, OR

END IF
END SUB

'*********************************************************************
' This routine tells the plotter to listen then the computer
' relinquishes control of the gpib to allow dumb instruments to send
' data to the plotter.  It is used specifically for the HP4145 plotting
' from using its front panel controls.
'*********************************************************************
SUB qplot4145
  PRINT
  PRINT "DG plotting of HP4145 data."
  arg$ = "UNT UNL MTA" + hp4145$ + " MLA" + plot$ + " DATA"
                  ' 4145 talking, plotter listening, controller out.
  CALL gpib(arg$, 0)
  PRINT "Data can be collected and plotted using front panel now."
  PRINT
  PRINT "When finished, press <ESC> to return to program."
  DO
  LOOP UNTIL INKEY$ = CHR$(27)
'   CALL send(hp4145$, "PF;", 0)               ' turn plotting off.
  CALL checkerror("PLOT4145", "controller")   ' read status after SRQ.
  PRINT "Data should have plotted out."
  CALL pause(2)
END SUB
'*********************************************************************
' This routine receives a maximum of count% characters from device$ into
' data$. If 'pr' argument is non-zero, the routine prints the message it
' sent to device$.
'*********************************************************************
SUB receive (device$, data$, count%, PR)
  poll = spoll%(device$, 0)                  ' poll device$ to see if present.

data$ = ""
  IF poll <> -1 THEN                         ' if device$ IS present...
    PRINT #1, "cac 0" + CHR$(13) + "sre 1"
    length$ = "#" + RIGHT$(STR$(count%), LEN(STR$(count%)) - 1)
    PRINT #1, "rd " + length$ + " " + device$  ' read length bytes.

' following statement is for debugging only, if pr is not 0.
    IF PR <> 0 THEN
      PRINT "rd " + length$ + " " + device$    ' read length bytes.
    END IF
```

```
      data$ = INPUT$(count%, #1)     ' input count% characters from COM1:.
      INPUT #1, ncount%              ' count% bytes actually received.
      ncount% = ABS(ncount%)
      CALL checkerror("receive", device$)    ' check for errors.
      data$ = LEFT$(data$, ncount%)          ' shorten data$ to bytes sent.
   END IF
END SUB '*******************************************************************
' This routine allows one to save program settings or data files on
' the HP4145.
'*******************************************************************
SUB save4145
   clin = CSRLIN
   ccol = POS(0)
   DO
     valid = 1
     PRINT
     PRINT "Save program/data on HP4145."
     PRINT "Saving P(rogram), D(ata/program), or (Auto) S(equence File)?";
     DO
        choice$ = UCASE$(INKEY$)
     LOOP UNTIL choice$ <> ""
     SELECT CASE choice$
        CASE "P"
          func$ = "P "
        CASE "D"
          func$ = "D "
        CASE "S"
          func$ = "S "
        CASE ELSE
          valid = 0
          LOCATE clin, ccol
     END SELECT
     IF valid = 1 THEN
        PRINT "Enter filename (6 char) and comment (8 char): nnnnnn cccccccc :"

INPUT name$
        CALL send(hp4145$, UCASE$("SV '" + func$ + name$ + "';"), 0)
        PRINT "Saving file on HP4145."
     END IF
   LOOP UNTIL valid = 1
   CALL pause(2)
END SUB SUB scan26 (noc, relay)
'*************************************************************
'  This subroutine will either open or close a relay
'on scanner 26.  If the relay is to be closed then noc=1.
'If the relay is to be open then noc=0.  The relay number
'is in relay.
'*************************************************************
CALL gpib("mla26", 0)
   IF noc = 0 THEN
   sstr$ = "open " + STR$(relay)
   ELSE sstr$ = "close " + STR$(relay)
   END IF
CALL send(si5010$, sstr$, 0)
END SUB
```

```
SUB scanc
'**********************************************
' This subroutine will use  turn the appropriate scanner relays
' on depending on whats in array con(16)
'**********************************************
noc = con(4)
CALL scan26(noc, 3)
CALL scan26(noc, 5)
noc = con(2)
CALL scan26(noc, 1)
CALL scan26(noc, 5)
CALL scan26(noc, 9)
CALL scan26(noc, 13)
noc = con(3)
CALL scan26(noc, 2)
CALL scan26(noc, 6)
CALL scan26(noc, 10)
CALL scan26(noc, 14)
IF con(4) = 1 THEN
CALL scan26(1, 5)
END IF
END SUB '******************************************************************
' This routine will send instruct$ to device$.  It is limited to a single
' device.  If 'pr' argument is non-zero, the routine prints the message it
' sent to device$.
'******************************************************************
SUB send (device$, instruct$, PR)
   poll = spoll%(device$, 0)          ' poll device$ to see if present.
   IF poll <> -1 THEN                 ' if device$ IS present...
      PRINT #1, "cac 0" + CHR$(13) + "sre 1"
      length$ = "#" + RIGHT$(STR$(LEN(instruct$)), LEN(STR$(LEN(instruct$))) - 1)

' construct length parameter for wrt.

PRINT #1, "wrt " + length$ + " " + device$ + CHR$(13) + instruct$ + CHR$(10)

' write to device, counts on print <CR>.

' following statement is for debugging only, if pr is not 0.

IF PR <> 0 THEN
         PRINT "wrt " + length$ + " " + device$ + CHR$(13) + instruct$
      END IF
      CALL checkerror("send", device$)    ' check for errors.
   END IF
END SUB '******************************************************************
' This routine does a serial poll on a device (dev$) and returns the poll
' byte as the function value.  If pr is not zero, debugging messages are
' printed.
'******************************************************************
FUNCTION spoll% (dev$, PR)
   PRINT #1, "rsp " + dev$       ' issue serial poll command to controller.
   IF PR <> 0 THEN PRINT "rsp " + dev$           ' for debugging only.
   LINE INPUT #1, poll$          ' read poll results from controller.
   IF PR <> 0 THEN PRINT "poll byte of " + dev$ + "=" + poll$  ' for debugging.
```

```
  spoll% = VAL(poll$)         ' assign integer result as function value.
END FUNCTION '*******************************************************************
'  This routine checks the devices on the GPIB that might generate a service
'  request and prints out an informative message on the status of the device
'  requesting service.  The serial poll of each device should clear the SRQ
'  line of the bus.  This check is for unexpected service requests since
'  we don't do anything about actually servicing the instruments in this
'  routine.  If you are expecting an SRQ (say at the completion of some
'  action by the instrument), you will have to write some specific code
'  for that instrument.
'*******************************************************************
SUB srqchk
  poll1 = spoll%(hp4145$, 0)
  poll2 = spoll%(k619A$, 0)
  poll3 = spoll%(k619B$, 0)
  poll4 = spoll%(k224$, 0)
  poll5 = spoll%(fg5010$, 0)
  poll6 = spoll%(ps5010$, 0)
  poll7 = spoll%(si5010$, 0)
  IF (poll1 AND 64) AND (poll1 >= 0) THEN
    PRINT "GPIB SRQ by HP4145, status = " + byte$(poll1)
    IF (poll1 AND 128) THEN
      IF (poll1 AND 32) THEN PRINT "Power failure"
      IF (poll1 AND 8) THEN PRINT "SMU shutdown"
      IF (poll1 AND 2) THEN PRINT "Fixture lid open"
    ELSE
      IF (poll1 AND 8) THEN PRINT "Illegal program"
      IF (poll1 AND 4) THEN PRINT "PRINT or PLOT completed"
      IF (poll1 AND 2) THEN PRINT "Syntax error"
      IF (poll1 AND 1) THEN PRINT "Data ready"
    END IF
  END IF
  IF (poll2 AND 64) AND (poll2 >= 0) THEN
    PRINT "GPIB SRQ by Keithly 619A channel A, status = " + byte$(poll2)
    IF (poll2 AND 32) THEN
      PRINT "Command error"
    ELSE
      PRINT "Overflow data error"
    END IF
  END IF
  IF (poll3 AND 64) AND (poll3 >= 0) THEN
    PRINT "GPIB SRQ by Keithly 619A channel B, status = " + byte$(poll3)
    IF (poll3 AND 32) THEN
      PRINT "Command/command option syntax error"
    ELSE
      PRINT "Overflow data error"
    END IF
  END IF
  IF (poll4 AND 64) AND (poll4 >= 0) THEN
    PRINT "GPIB SRQ by Keithly 224, status = " + byte$(poll4)
    IF (poll4 AND 32) THEN
      PRINT "Command/command option syntax error"
    ELSE
      PRINT "Overflow data error"
    END IF
  END IF
```

```
   IF (poll5 AND 64) AND (poll5 >= 0) THEN
      PRINT "GPIB SRQ by Tektronix FG 5010, status = " + byte$(poll5)
      IF poll5 AND 97 THEN
         PRINT "Command error."
      END IF
      IF poll5 AND 98 THEN
         PRINT "Execution error."
      END IF
      IF poll5 AND 99 THEN
         PRINT "Internal error."
      END IF
   END IF
   IF (poll6 AND 64) AND (poll6 >= 0) THEN
      PRINT "GPIB SRQ by Tektronix PS 5010, status = " + byte$(poll6)
      IF poll6 AND 97 THEN
         PRINT "Command error."
      END IF
      IF poll6 AND 98 THEN
         PRINT "Execution error."
      END IF
      IF poll6 AND 99 THEN
         PRINT "Internal error."
      END IF
   END IF
   IF (poll7 AND 64) AND (poll7 >= 0) THEN
      PRINT "GPIB SRQ by Tektronix SI 5010, status = " + byte$(poll7)
      IF poll7 AND 97 THEN
         PRINT "Command error."
      END IF
      IF poll7 AND 98 THEN
         PRINT "Execution error."
      END IF
      IF poll7 AND 99 THEN
         PRINT "Internal error."
      END IF
   END IF
END SUB SUB stage
'*******************************************
'  This program controls the hot stage
'
IF str(2) > 99 THEN
   lt$ = RIGHT$(STR$(str(2)), 3)
   ELSE
   lt$ = "0" + RIGHT$(STR$(str(2)), 2)
END IF
IF str(3) > 99 THEN
   ht$ = RIGHT$(STR$(str(3)), 3)
   ELSE
   ht$ = "0" + RIGHT$(STR$(str(3)), 2)
END IF
IF str(4) > 9 THEN
   st$ = RIGHT$(STR$(str(4)), 2) + "00"
   ELSE
   st$ = "0" + RIGHT$(STR$(str(4)), 1) + "00"
END IF
sstr$ = "RAH" + ht$ + "C" + lt$ + "S" + st$ + "E"   'The string is prepared
CALL send(stag$, sstr$, 0)                          'The cycle is begun
```

```
sstr$ = "D2"
bytes% = 48
t = TIMER
DO
   CALL send(stag$, sstr$, 0)
   CALL receive(stag$, rstr$, bytes%, 0)
   tmp$ = RIGHT$(LEFT$(rstr$, 2), 1)
   LOCATE 1, 30
   PRINT tmp$
t2 = TIMER
  DO
  LOOP UNTIL TIMER - t2 > 2
LOOP UNTIL TIMER - t > str(5) * 60 OR tmp$ = "W"
END SUB '***************************************************************
' This routine asks the gpib controller to report its status.  The controller ' returns information in 4 numeric code strings which this routine converts
' into mnemonics (see 5-48..49 in gpib user manual).  It returns the integer
' value of the status byte (for testing by caller) and the mnemonic string
' for reporting errors if needed.
'***************************************************************
SUB status (arg%, arg$)
   PRINT #1, "stat n"       ' request status from gpib controller.
   LINE INPUT #1, arg$      ' read status code into string.
   LINE INPUT #1, gpiberr$  ' read gpib interface error code.
   LINE INPUT #1, sperr$    ' read serial interface error code.
   LINE INPUT #1, cnt$      ' read count of bytes transferred.

arg% = VAL(arg$)         ' convert status code into integer.
   arg$ = "STATUS -"        ' reinitialize status string.
   IF arg% < 0 THEN arg$ = arg$ + " ERR"              ' interpret numeric
   IF (arg% AND 16384) <> 0 THEN arg$ = arg$ + " TIMO"  ' status code into
   IF (arg% AND 8192) <> 0 THEN arg$ = arg$ + " END"    ' mnemonics.
   IF (arg% AND 4096) <> 0 THEN arg$ = arg$ + " SRQ"
   IF (arg% AND 256) <> 0 THEN arg$ = arg$ + " CMPL"
   IF (arg% AND 128) <> 0 THEN arg$ = arg$ + " LOK"
   IF (arg% AND 64) <> 0 THEN arg$ = arg$ + " REM"
   IF (arg% AND 32) <> 0 THEN arg$ = arg$ + " CIC"
   IF (arg% AND 16) <> 0 THEN arg$ = arg$ + " ATN"
   IF (arg% AND 8) <> 0 THEN arg$ = arg$ + " TACS"
   IF (arg% AND 4) <> 0 THEN arg$ = arg$ + " LACS"
   IF (arg% AND 2) <> 0 THEN arg$ = arg$ + " DTAS"
   IF (arg% AND 1) <> 0 THEN arg$ = arg$ + " DCAS"
   gpiberr = VAL(MID$(gpiberr$, 2, LEN(gpiberr$) - 1)) ' strip leading CR in
                                                      ' gpiberr$.
   SELECT CASE gpiberr              ' interpret gpib error code into
      CASE 0                         ' mnemonics.
         gpiberr$ = " NGER"
      CASE 1
         gpiberr$ = " ECIC"
      CASE 2
         gpiberr$ = " ENOL"
      CASE 3
         gpiberr$ = " EADR"
      CASE 4
         gpiberr$ = " EARG"
```

```
  CASE 5
    gpiberr$ = " ESAC"
  CASE 6
    gpiberr$ = " EABO"
  CASE 11
    gpiberr$ = " ECAP"
  CASE 17
    gpiberr$ = " ECMD"
  CASE ELSE
    gpiberr$ = " GPIB error #" + STR$(gpiberr)
END SELECT sperr = VAL(RIGHT$(sperr$, LEN(sperr$) - 1))   ' strip leading CR in
                                                ' sperr$.

SELECT CASE sperr              ' interpret serial port error code into
  CASE 0                        ' mnemonics.
    sperr$ = " NSER"
  CASE 1
    sperr$ = " EPAR"
  CASE 2
    sperr$ = " EORN"
  CASE 3
    sperr$ = " EOFL"
  CASE 4
    sperr$ = " EFRM"
  CASE ELSE
    sperr$ = " Serial error #" + STR$(sperr)
END SELECT cnt$ = " -" + cnt$ + " bytes"              ' bytes transferred over gpib.

arg$ = arg$ + " -" + gpiberr$ + sperr$ + cnt$    ' assemble full string
                                                  ' for return.
END SUB
SUB strmm
'****************************************************************
'This subroutine prints out the menu for stress selection menu
'****************************************************************
DIM a$(20)
CLS
ns = 7
a$(1) = "Main Capacitor Menu"
a$(2) = "Low Temperature"
a$(3) = "High Temperature"
a$(4) = "Soak Time (minutes)"
a$(5) = "Maximum Time to Cool Down"
a$(6) = "Positive Stress (666=no)"
a$(7) = "Negative Stress (666=no)"
LOCATE 1, 30
COLOR 7, 1
PRINT "Stress Selection"
COLOR 7, 0
LOCATE 4, 20
PRINT a$(1)
FOR i = 2 TO ns
LOCATE (2 + i * 2), 20
PRINT a$(i)
```

```
            LOCATE (2 + i * 2), 50
            PRINT str(i)
         NEXT i
         DO
            i = 1
               DO
                  LOCATE (2 + i * 2), 16
                  COLOR 7, 4
                  PRINT "0"
                     DO
                        tmp$ = INKEY$
                     LOOP UNTIL tmp$ <> ""
                  COLOR 7, 0
                  IF tmp$ = "s" AND i > 1 THEN
                     LOCATE 20, 16
                     INPUT "Type in new value"; str(i)
                     LOCATE 20, 16
                     PRINT "                                  "
                     LOCATE (2 + i * 2), 50
                     PRINT "           "
                     LOCATE (2 + i * 2), 50
                     PRINT str(i)
                  END IF
                  LOCATE (2 + i * 2), 16
                  PRINT " "
                  i = i + 1
               LOOP UNTIL tmp$ = "s" OR i = ns + 1
            LOOP UNTIL i = 2
         END SUB '***************************************************************************
' This routine measures a voltage with Keithly 619 channel 'select$' in
' voltage mode, returning measured voltage in 'volts'.
'***************************************************************************
SUB VoltMeas (select$, volts)
   SELECT CASE select$
      CASE "A"
         channel$ = k619A$                   ' gpib address for channel A.
         valid = 1                           ' valid channel was requested.
      CASE "B"
         channel$ = k619B$                   ' gpib address for channel B.
         valid = 1                           ' valid channel was requested.
      CASE ELSE
         PRINT "VoltMeas - Unknown voltage channel requested"
         valid = 0                           ' selected channel not valid.
   END SELECT
   IF valid = 1 THEN                         ' if valid, measure voltage.
      CALL send(channel$, "F0X", 0)          ' measure with channel 'select$'.
      CALL receive(channel$, volt$, 20, 0)   ' read measurement into volt$.
      IF MID$(volt$, 2, 1) = "N" THEN
         volt$ = RIGHT$(volt$, LEN(volt$) - 5) ' strip "<LF>NDCV" from data.
         volt$ = LEFT$(volt$, LEN(volt$) - 1)  ' strip <CR> from data.
         volts = VAL(volt$)                    ' convert string.
      ELSE
         PRINT "Electrometer has overflow voltage. Control Break."
         ' Do something about restarting here?
      END IF
   END IF
END SUB
```

Having thus described the invention, what is claimed is:

1. A method of characterizing electrically thin semiconductor films, comprising the steps of:
    (a) forming a capacitor and a separate electrical contact on the same side of said electrically thin semiconductor film; and
    (b) measuring electrical transfer characteristics of said capacitor to determine the electrical characteristics of said electrically thin semiconductor film.

2. The method of claim 1 wherein said electrically thin semiconductor film is formed on an insulating substrate.

3. The method of claim 2 wherein forming said capacitor and forming said separate electrical contact are performed substantially concurrently.

4. The method of claim 1 wherein said measuring includes connecting a measuring system to said capacitor and said separate electrical contact.

5. The method of claim 4 wherein said measuring also includes taking capacitance and voltage measurements of said capacitor to determine the electrical characteristics of said electrically thin semiconductor film and its interfaces with adjacent materials.

6. The method of claim 1 wherein said measuring includes taking capacitance and voltage measurements to determine the electrical transfer characteristics of said capacitor.

7. The method of claim 6 wherein said measuring includes:
    applying a small amplitude sinusoidal driving signal to said capacitor; and
    measuring in-phase and out-of-phase components of said capacitor's response to the application of said driving signal.

8. The method of claim 7 wherein said measuring of in-phase and out-of-phase components is performed using a lock-in amplifier.

9. The method of claim 1 wherein said step of measuring includes the step of substantially simultaneously deriving the capacitance and resistance of the region of said electrically thin semiconductor film between said capacitor and said separate electrical contact.

10. An apparatus for characterizing an electrically thin semiconductor film comprising:
    an electrically thin semiconductor film having a capacitor and a separate electrical contact constructed on the same side of said film; and
    means electrically connected to said capacitor and said electrical contact for measuring electrical transfer characteristics of said capacitor to thereby characterize said electrically thin semiconductor film.

11. The apparatus of claim 10 wherein said apparatus includes:
    a layer of insulating substrate supporting said electrically thin semiconductor film.

12. The apparatus of claim 11 wherein said measuring means is a capacitance-voltage measuring system electrically connected to said capacitor and said separate electrical contact.

13. The apparatus of claim 10 wherein said measuring means comprises:
    means for applying a small amplitude sinusoidal driving signal to said capacitor; and
    means connected to said capacitor and said electrical contact and to said signal applying means for measuring in-phase and out-of-phase components of the response of said capacitor to the application of said driving signal.

14. The apparatus of claim 13 wherein said response measuring means is a lock-in amplifier.

15. The apparatus of claim 13 wherein said signal applying means is a function generator.

16. The apparatus of claim 10 wherein said means for measuring includes means for substantially simultaneously deriving the capacitance and resistance of the region of said electrically thin semiconductor film between said capacitor and said separate electrical contact.

17. A method of characterizing the quality of an electrically thin semiconductor film comprising the steps of:
    modulating the electrical potential at one location on a surface of said film; and
    measuring the variation in electrical conductivity of said film between said one location and another location on said same surface of said film.

18. The method of claim 17 wherein said film is a fully depleted film.

19. The method of claim 18 wherein said step of modulating includes the step of forming a capacitor on said surface.

20. The method of claim 19 wherein said capacitor is an integrated circuit capacitor having said semiconductor film as a portion thereof.

21. The method of claim 19 wherein said step of measuring includes forming a contact on said surface of said film, said contact being remote from said capacitor.

22. The method of claim 21 wherein said step of modulating includes applying a voltage to said capacitor and varying said voltage.

23. The method of claim 22 wherein said step of measuring includes the step of measuring the capacitance of the region of said semiconductor film between said capacitor and said contact.

24. The method of claim 17 wherein said step of measuring includes the step of substantially simultaneously deriving the capacitance and resistance of the region of said electrically thin semiconductor film between said one location and said other location.

25. A method of characterizing the quality of a semiconductor film comprising the steps of:
    modulating the electrical potential at one location on a surface of said film, said modulating including the step of forming a capacitor on said surface; and
    measuring the variation in electrical conductivity of said film between said one location and another location on said same surface of said film.

26. The method of claim 25 wherein said film is a fully depleted film.

27. The method of claim 26 wherein said capacitor is an integrated circuit capacitor having said semiconductor film as a portion thereof.

28. The method of claim 27 wherein said step of measuring includes forming a contact on said surface of said film, said contact being remote from said capacitor.

29. The method of claim 28 wherein said step of modulating includes applying a voltage to said capacitor and varying said voltage.

30. The method of claim 29 wherein said step of measuring includes the step of measuring the capacitance of the region of said semiconductor film between said capacitor and said contact.

31. An apparatus for characterizing the quality of a semiconductor film on an insulating substrate comprising:
    means for modulating the electrical potential at one location on the surface of said film;
    means for measuring the variation in electrical conductivity of said film between said one location and another location on the same surface of said film;
    a capacitor formed on a surface of said film; and a separate electrical contact formed on said same surface of said film.

32. The method of claim 25 wherein said step of measuring includes the step of substantially simultaneously deriving the capacitance and resistance of the region of said semiconductor film between said one location and said other location.

33. The apparatus of claim 31 wherein said modulating means comprises:
    a function generator operatively connected to said capacitor.

34. The apparatus of claim 33 wherein said measuring means comprises:
    a phase sensitive amplifier.

35. The apparatus of claim 34 wherein said phase sensitive amplifier is a lock-in amplifier.

36. The apparatus of claim 35 further comprising a computer operatively connected to said amplifier.

37. The apparatus of claim 34 further comprising a computer operatively connected to said amplifier.

38. The apparatus of claim 31 wherein said film is a semiconductor film for which there exists some surface potential such that a change in this potential results in a change in the potential at the semiconductor/substrate interface.

39. The method of claim 31 wherein said means for measuring includes means for substantially simultaneously deriving the capacitance and resistance of the region of said semiconductor film between said one location and said other location.

40. An apparatus for characterizing the quality of a semiconductor film on an insulating substrate comprising:
    means for modulating the electrical potential at one location on the surface of said film; and
    means for measuring electrical variations in said film between said one location and another location on the same surface of said film, said means for measuring including means for substantially simultaneously deriving the capacitance and resistance of the region of said semiconductor film between said one location and said other location.

41. The apparatus of claim 40 wherein said film is a semiconductor film for which there exists some surface potential such that a change in this potential results in a change in the potential at the semiconductor/substrate interface.

42. The method of claim 41 wherein said means for measuring includes means for substantially simultaneously deriving the capacitance and resistance of the region of said semiconductor film between said one location and said other location.

* * * * *